(12) United States Patent
Balteanu et al.

(10) Patent No.: US 10,080,192 B2
(45) Date of Patent: Sep. 18, 2018

(54) APPARATUS AND METHODS FOR ENVELOPE TRACKING SYSTEMS

(71) Applicant: SKYWORKS SOLUTIONS, INC., Woburn, MN (US)

(72) Inventors: Florinel G. Balteanu, Irvine, CA (US); David Steven Ripley, Marion, IA (US); Sabah Khesbak, Irvine, CA (US); Jeffrey Gordon Strahler, Greensboro, NC (US); Roman Zbigniew Arkiszewski, Oak Ridge, NC (US); Yevgeniy A. Tkachenko, Belmont, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/493,580

(22) Filed: Apr. 21, 2017

(65) Prior Publication Data

US 2017/0223632 A1 Aug. 3, 2017

Related U.S. Application Data

(63) Continuation of application No. 15/018,413, filed on Feb. 8, 2016, now Pat. No. 9,668,215, which is a (Continued)

(51) Int. Cl.
*H01Q 11/12* (2006.01)
*H04B 1/04* (2006.01)
(Continued)

(52) U.S. Cl.
CPC .......... *H04W 52/0225* (2013.01); *H03F 1/02* (2013.01); *H03F 1/0222* (2013.01);
(Continued)

(58) Field of Classification Search
CPC .... H03F 1/0216; H03F 1/0227; H03F 1/0238; H03G 3/3042
(Continued)

(56) References Cited

U.S. PATENT DOCUMENTS 5,929,776 A * 7/1999 Warble ................. H03F 1/0227
330/10
6,191,653 B1 2/2001 Camp, Jr. et al.
(Continued)

FOREIGN PATENT DOCUMENTS

CN 1829079 A 9/2006
CN 101090380 A 12/2007
(Continued)

OTHER PUBLICATIONS

Hassan et al., A Combined Series-Parallel Hybrid Envelope Amplifier for Envelope Tracking Mobile Terminal RF Power Amplifier Applications, IEEE Journal of Solid-State Circuits, pp. 1185-1198, vol. 47, No. 5, May 2012.
(Continued)

*Primary Examiner* — Simon Nguyen
(74) *Attorney, Agent, or Firm* — Knobbe Martens Olson & Bear LLP

(57) ABSTRACT

Apparatus and methods for envelope tracking systems are disclosed herein. In certain implementations, an envelope tracking system for generating a power amplifier supply voltage for a power amplifier is provided. The envelope tracking system includes a DC-to-DC converter that generates a regulated voltage from a battery voltage and controls a voltage of the regulated voltage using a low frequency feedback signal. The envelope tracking system further includes an error amplifier that generates an output current using an envelope signal and a high frequency feedback signal. The low frequency feedback signal is based on a low
(Continued)

frequency component of the power amplifier supply voltage and the high frequency feedback signal is based on a high frequency component of the power amplifier supply voltage. The error amplifier generates the power amplifier supply voltage by adjusting the magnitude of the regulated voltage using the output current.

20 Claims, 20 Drawing Sheets

Related U.S. Application Data continuation of application No. 14/640,917, filed on Mar. 6, 2015, now Pat. No. 9,294,054, which is a continuation of application No. 13/763,380, filed on Feb. 8, 2013, now Pat. No. 8,981,847.

(60) Provisional application No. 61/597,048, filed on Feb. 9, 2012, provisional application No. 61/658,714, filed on Jun. 12, 2012.

(51) Int. Cl.
| | |
|---|---|
| H04W 52/02 | (2009.01) |
| H03F 1/02 | (2006.01) |
| H03F 3/19 | (2006.01) |
| H03F 3/193 | (2006.01) |
| H03F 3/21 | (2006.01) |
| H04B 1/40 | (2015.01) |
| H03F 1/56 | (2006.01) |
| H03F 3/195 | (2006.01) |
| H03F 3/24 | (2006.01) |
| H04W 88/02 | (2009.01) |

(52) U.S. Cl.
CPC ............ *H03F 1/0227* (2013.01); *H03F 1/56* (2013.01); *H03F 3/19* (2013.01); *H03F 3/193* (2013.01); *H03F 3/195* (2013.01); *H03F 3/211* (2013.01); *H03F 3/245* (2013.01); *H04B 1/40* (2013.01); *H03F 2200/102* (2013.01); *H03F 2200/171* (2013.01); *H03F 2200/336* (2013.01); *H03F 2200/387* (2013.01); *H03F 2200/451* (2013.01); *H03F 2203/21193* (2013.01); *H04W 88/02* (2013.01); *Y02D 70/00* (2018.01); *Y02D 70/1262* (2018.01); *Y02D 70/142* (2018.01); *Y02D 70/26* (2018.01)

(58) Field of Classification Search
USPC ..................................................... 455/127.1
See application file for complete search history.

(56) References Cited

U.S. PATENT DOCUMENTS

| | | | |
|---|---|---|---|
| 7,342,445 B2 | 3/2008 | Aridas et al. | |
| 7,420,411 B2 * | 9/2008 | Herzinger | H03G 3/3047 330/10 |
| 7,696,818 B2 | 4/2010 | Kunihiro et al. | |
| 7,696,826 B2 | 4/2010 | Ripley et al. | |
| 7,978,008 B2 * | 7/2011 | Ito | H03G 3/004 330/136 |
| 8,493,142 B2 * | 7/2013 | Tadano | H03G 3/3042 330/127 |
| 8,570,105 B2 * | 10/2013 | Wimpenny | H03F 1/0227 330/127 |
| 8,981,847 B2 | 3/2015 | Balteanu | |
| 9,143,096 B2 | 9/2015 | Balteanu et al. | |
| 9,294,054 B2 | 3/2016 | Balteanu et al. | |
| 9,668,215 B2 * | 5/2017 | Balteanu | H03F 1/02 |
| 2005/0064830 A1 * | 3/2005 | Grigore | H03C 5/00 455/127.4 |
| 2006/0119425 A1 | 6/2006 | Phillips et al. | |
| 2008/0012637 A1 | 1/2008 | Aridas et al. | |
| 2008/0258831 A1 * | 10/2008 | Kunihiro | H03C 5/00 332/103 |
| 2009/0088096 A1 | 4/2009 | Sun et al. | |
| 2009/0096531 A1 * | 4/2009 | Shimamoto | H03F 1/0216 330/297 |
| 2011/0279180 A1 | 11/2011 | Yamanouchi et al. | |
| 2011/0298545 A1 * | 12/2011 | Morimoto | H03F 1/0216 330/296 |
| 2012/0194274 A1 * | 8/2012 | Fowers | H03F 1/0238 330/293 |
| 2013/0207731 A1 | 8/2013 | Balteanu | |
| 2013/0217345 A1 | 8/2013 | Balteanu et al. | |
| 2016/0241138 A1 | 8/2016 | Pehlke | |

FOREIGN PATENT DOCUMENTS

| | | |
|---|---|---|
| CN | 101098171 A | 1/2008 |
| CN | 101674056 A | 3/2010 |
| CN | 101807890 A | 8/2010 |
| CN | 102013876 A | 4/2011 |
| JP | H 10-507832 A | 7/1998 |
| KR | 10-0581268 B1 | 9/2006 |
| KR | 2014-0026510 A | 3/2014 |
| WO | WO 96/12630 | 5/1996 |
| WO | WO 98/00929 | 1/1998 |

OTHER PUBLICATIONS

International Search Report and Written Opinion of the International Search Authority in PCT/US2013/024797, dated May 15, 2013, 12 pages.

Notice of Allowance dated May 13, 2015, in U.S. Appl. No. 13/763,410 (11 pages).

Office Action dated Jan. 2, 2015 in U.S. Appl. No. 13/763,410 (19 pages).

Third party submission under 37 CFR 1.290 filed in U.S. Appl. No. 13/763,410 (18 pages). Included in the submission is a third party claim chart asserting alleged correspondence between claims of U.S. Appl. No. 13/763,410 and Grigore (US 2005/0064830).

* cited by examiner

APPARATUS AND METHODS FOR ENVELOPE TRACKING SYSTEMS

CROSS-REFERENCE TO RELATED APPLICATIONS

This application is a continuation of U.S. patent application Ser. No. 15/018,413, filed Feb. 8, 2016 and titled "APPARATUS AND METHODS FOR ENVELOPE TRACKING IN A MOBILE DEVICE," which is a continuation of U.S. patent application Ser. No. 14/640,917, filed Mar. 6, 2015 and titled "APPARATUS AND METHODS FOR ENVELOPE TRACKERS," which is a continuation of U.S. patent application Ser. No. 13/763,380, filed Feb. 8, 2013 and titled "APPARATUS AND METHODS FOR ENVELOPE TRACKING," which claims the benefit of priority under 35 U.S.C. §119(e) of U.S. Provisional Patent Application No. 61/597,048, filed Feb. 9, 2012 and entitled "APPARATUS AND METHODS FOR ENVELOPE TRACKING," and of U.S. Provisional Patent Application No. 61/658,714, filed Jun. 12, 2012 and entitled "APPARATUS AND METHODS FOR ENVELOPE TRACKING," each of which are herein incorporated by reference in their entireties.

BACKGROUND

Field

Embodiments of the invention relate to electronic systems, and in particular, to envelope tracking systems for radio frequency (RF) electronics.

Description of the Related Technology

Power amplifiers can be included in mobile devices to amplify an RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal having a relatively low power. It can be important to manage RF signal amplification, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which a supply voltage of the power amplifier is controlled in relation to the envelope of the RF signal or signal envelope. Thus, when a voltage level of the signal envelope increases the voltage level of the power amplifier supply voltage can be increased. Likewise, when the voltage level of the signal envelope decreases the voltage level of the power amplifier supply voltage can be decreased to reduce power consumption.

There is a need for improved power amplifier systems. Furthermore, there is a need for improved envelope trackers.

SUMMARY

In certain embodiments, the present disclosure relates to a mobile device. The mobile device includes a power amplifier, a buck converter, and an error amplifier. The power amplifier is configured to receive a power amplifier supply voltage and to amplify a radio frequency (RF) input signal to generate an RF output signal. The buck converter is configured to convert a battery voltage into a buck voltage, and to control a magnitude of the buck voltage based on an error current. The error amplifier is configured to generate an output current based on an envelope of the RF input signal and to generate the power amplifier supply voltage by adjusting the magnitude of the buck voltage using the output current. The error amplifier is configured to control the buck converter by changing a magnitude of the error current in relation to a magnitude of the output current.

In various embodiments, the mobile device further includes an AC coupling capacitor electrically connected between the power amplifier supply voltage and an output of the error amplifier configured to generate the output current.

In some embodiments, the buck converter includes a buck controller, a buck inductor and a plurality of buck switches, and the buck controller is configured to use the error current to control a state of the plurality of buck switches so as to control a current through the buck inductor.

In a number of embodiments, the error current includes a non-inverted error current component and an inverted error current component, and the buck converter includes a current comparator configured to control the state of the plurality of buck switches by comparing the non inverted error current component to the inverted error current component.

In accordance with several embodiments, the error amplifier includes a first pair of transistors configured to generate the output current and a second pair of transistors configured to generate the error current, and the second pair of transistors are implemented as a replica of the first pair of transistors.

In some embodiments, the mobile device further includes an antenna configured to receive the RF output signal.

In a number of embodiments, the mobile device further includes a transceiver configured to generate the envelope of the RF input signal.

In certain embodiments, the mobile device further includes a battery configured to generate the battery voltage.

In several embodiments, the error amplifier is powered using the battery voltage.

In some embodiments, the mobile device further includes a boost converter configured to convert the battery voltage into a boost voltage having a voltage magnitude greater than a voltage magnitude of the battery voltage. The error amplifier is powered using the boost voltage.

In certain embodiments, the present disclosure relates to an envelope tracker for generating a power amplifier supply voltage. The envelope tracker includes a buck converter and an error amplifier. The buck converter is configured to convert a battery voltage into a buck voltage, and to control a magnitude of the buck voltage based on an error current. The error amplifier is configured to generate an output current based on an envelope signal and to generate the power amplifier supply voltage by adjusting the magnitude of the buck voltage using the output current. The error amplifier is configured to control the buck converter by changing a magnitude of the error current in relation to a magnitude of the output current.

In accordance with a number of embodiments, the error amplifier includes a first input configured to receive the envelope signal, a second input, and an output configured to generate the output current. In some embodiments, the envelope tracker further includes a feedback circuit electrically connected between the second input of the error amplifier and the output of the error amplifier. In a number of embodiments, the envelope tracker further includes an AC coupling capacitor disposed between the output of the error amplifier and the power amplifier supply voltage.

In certain embodiments, the error amplifier is powered using the battery voltage.

According to several embodiments, the envelope tracker further includes a boost converter configured to convert the battery voltage into a boost voltage having a voltage magnitude greater than a voltage magnitude of the battery voltage. The error amplifier is powered using the boost voltage.

In various embodiments, the buck converter includes a buck controller, a buck inductor and a plurality of buck switches. The buck controller is configured to use the error current to control a state of the plurality of buck switches so as to control a current through the buck inductor.

In a number of embodiments, the error current includes a non-inverted error current component and an inverted error current component, and the buck converter includes a current comparator configured to control the state of the plurality of buck switches by comparing the non inverted error current component to the inverted error current component.

In some embodiments, the error amplifier includes a first pair of transistors configured to generate the output current and a second pair of transistors configured to generate the error current, and the second pair of transistors are implemented as a replica of the first pair of transistors. In various embodiments, the first pair of transistors includes a first p type field effect transistor (PFET) and a first n type field effect transistor (NFET) and the second pair of transistors includes a second PFET and a second NFET.

In certain embodiments, the present disclosure relates to a method of generating a power amplifier supply voltage. The method includes generating a buck voltage from a battery voltage using a buck converter, controlling a magnitude of the buck voltage based on an error current, generating an output current based on an envelope signal using an error amplifier, generating the power amplifier supply voltage by adjusting the magnitude of the buck voltage using the output current, and controlling the buck converter by changing a magnitude of the error current in relation to a magnitude of the output current.

In various embodiments, the buck converter includes a buck inductor and a plurality of buck switches, and the method further includes controlling a current through the buck inductor by controlling a state of the plurality of buck switches based on the error current.

In some embodiments, the error current includes a non-inverted error current component and an inverted error current component, and the method further includes controlling the state of the plurality of buck switches by comparing the non-inverted error current component to the inverted error current component.

In certain embodiments, the method further includes providing the power amplifier supply voltage to a power amplifier.

According to a number of embodiments, the method further includes powering the error amplifier using the battery voltage.

In various embodiments, the method further includes generating a boost voltage using a boost converter and powering the error amplifier using the boost voltage.

In certain embodiments, the present disclosure relates a multi-chip module (MCM). The MCM includes a buck converter and an error amplifier. The buck converter is configured to convert a battery voltage into a buck voltage, and to control a magnitude of the buck voltage based on an error current. The error amplifier is configured to generate an output current based on an envelope signal and to generate the power amplifier supply voltage by adjusting the magnitude of the buck voltage using the output current. The error amplifier is configured to control the buck converter by changing a magnitude of the error current in relation to a magnitude of the output current.

In various embodiments, the error amplifier includes a first input configured to receive the envelope signal, a second input, and an output configured to generate the power amplifier supply voltage. According to some embodiments, the MCM further includes a feedback circuit electrically connected between the second input of the error amplifier and the output of the error amplifier. In certain embodiments, the MCM further includes an AC coupling capacitor disposed between the output of the error amplifier and the power amplifier supply voltage.

In some embodiments, the MCM further includes a power amplifier configured to receive the power amplifier supply voltage.

In certain embodiments, the present disclosure relates to an envelope tracking system for generating a power amplifier supply voltage. The envelope tracking system includes a DC-to-DC converter and an error amplifier. The DC-to-DC converter is configured to generate a regulated voltage from a battery voltage, and to control a voltage magnitude of the regulated voltage using a low frequency feedback signal that is based on a low frequency component of the power amplifier supply voltage. The error amplifier is configured to generate an output current using an envelope signal and a high frequency feedback signal that is based on a high frequency component of the power amplifier supply voltage. Additionally, the error amplifier is configured to generate the power amplifier supply voltage by adjusting the magnitude of the regulated voltage using the output current.

In various embodiments, the error amplifier includes a first input configured to receive the envelope signal, a second input configured to receive the high frequency feedback signal, and an output configured to generate the output current. According to some embodiments, the envelope tracking system further includes an AC coupling capacitor electrically connected between the output of the error amplifier and the power amplifier supply voltage. According to certain embodiments, the envelope tracking system further includes a feedback circuit configured to generate the high frequency feedback signal. In various embodiments, the feedback circuit includes a first feedback resistor electrically connected between the output of the error amplifier and the second input of the error amplifier and a second feedback resistor electrically connected between the second input of the error amplifier and a power low supply voltage.

In several embodiments, the error amplifier is powered using the battery voltage.

In accordance with certain embodiments, the envelope tracking system further includes an inductor electrically connected between the regulated voltage and the power amplifier supply voltage.

In some embodiments, the DC-to-DC converter includes a buck converter configured to generate the regulated voltage.

In various embodiments, the envelope tracking system further includes a low pass filter configured to filter the power amplifier supply voltage to generate a filtered power amplifier supply voltage, and the low frequency feedback signal is based in part on the filtered power amplifier supply voltage. According to some embodiments, the envelope tracking system further includes a comparator configured to generate the low frequency feedback signal by comparing the filtered power amplifier supply voltage to a reference voltage. In several embodiments, the envelope tracking system further includes a reference voltage generator configured to generate the reference voltage.

In a number of embodiments, the envelope tracking system further includes a high pass filter configured to filter the power amplifier supply voltage to generate a filtered power amplifier supply voltage. In several embodiments, the envelope tracking system further includes a comparator configured to compare the filtered power amplifier supply voltage to the envelope signal to generate a high frequency envelope signal, and the error amplifier includes a first input configured to receive the high frequency envelope signal, a second input configured to receive the high frequency feedback signal, and an output configured to generate the output current.

In certain embodiments, the present disclosure relates to a wireless device. The wireless device includes a power management integrated circuit (PMIC) and a power amplifier module. The PMIC includes a DC-to-DC converter configured to generate a regulated voltage from a battery voltage, and to control a voltage level of the regulated voltage based on a voltage level of a control voltage. The power amplifier module includes a power amplifier configured to amplify a radio frequency (RF) signal and an error amplifier configured to generate an output current based on an envelope signal. The error amplifier is configured to generate a power amplifier supply voltage for the power amplifier by adjusting the voltage level of the regulated voltage using the output current. The power amplifier module is configured to change the voltage level of the control voltage based at least in part on the power amplifier supply voltage.

According to several embodiments, the wireless device further includes a transceiver configured to generate the RF signal and the envelope signal.

In some embodiments, the wireless device further includes a battery configured to generate the battery voltage.

In a number of embodiments, the power amplifier module further includes an inductor electrically connected between the regulated voltage and the power amplifier supply voltage.

In accordance with certain embodiments, the wireless device further includes a feedback circuit configured to generate a feedback signal that changes in response to a high frequency component of the power amplifier supply voltage, and the error amplifier includes a first input configured to receive the envelope signal, a second input configured to receive the feedback signal, and an output configured to generate the output current. In several embodiments, the power amplifier module further includes an AC coupling capacitor electrically connected between the output of the error amplifier and the power amplifier supply voltage.

In various embodiments, the power amplifier module further includes a low pass filter configured to filter the power amplifier supply voltage to generate a filtered power amplifier supply voltage, and the control voltage is based at least on part on the filtered power amplifier supply voltage. In some embodiments, the power amplifier module further includes a comparator configured to generate the control voltage by comparing the filtered power amplifier supply voltage to a reference voltage.

In certain embodiments, the present disclosure relates to a method of generating a power amplifier supply voltage. The method includes generating a regulated voltage from a battery voltage using a DC-to-DC converter, controlling a magnitude of the regulated voltage based on a control voltage, generating an output current based on an envelope signal using an error amplifier, generating a power amplifier supply voltage for a power amplifier by adjusting the magnitude of the regulated voltage using the output current, and controlling the DC-to-DC converter by changing a voltage level of the control voltage based at least in part on the power amplifier supply voltage.

In a number of embodiments, the method further includes providing the output current to the power amplifier supply voltage thru an AC coupling capacitor.

According to various embodiments, the method further includes generating a high frequency feedback signal for the error amplifier using a feedback circuit, and the high frequency feedback signal is configured to change in response to a high frequency component of the power amplifier supply voltage.

In several embodiments, the method further includes powering the error amplifier using the battery voltage.

According to various embodiments, the method further includes filtering the power amplifier supply voltage to generate a filtered power amplifier supply voltage using a low pass filter, and comparing the filtered power amplifier supply voltage to a reference voltage to generate the control voltage.

In certain embodiments, the present disclosure relates to a radio frequency system. The radio frequency system includes a power management integrated circuit (PMIC), a first power amplifier module, and a second power amplifier module. The PMIC includes a DC-to-DC converter configured to generate a regulated voltage from a battery voltage, and to control a voltage level of the regulated voltage using a plurality of control voltages. The first power amplifier module includes a first power amplifier configured to amplify a first radio frequency (RF) signal and a first error amplifier configured to generate a first power amplifier supply voltage for the first power amplifier by adjusting the voltage level of the regulated voltage based on an envelope of the first RF signal. The first power amplifier module is configured to change the voltage level of a first control voltage of the plurality of control voltages when the first power amplifier is enabled based at least in part on a voltage level of the first power amplifier supply voltage. The second power amplifier module includes a second power amplifier configured to amplify a second RF signal and a second error amplifier configured to generate a second power amplifier supply voltage for the second power amplifier by adjusting the voltage level of the regulated voltage based on an envelope of the second RF signal. The second power amplifier module is configured to change the voltage level of a second control voltage of the plurality of control voltages when the second power amplifier is enabled based at least in part on a voltage level of the second power amplifier supply voltage.

In various embodiments, the first power amplifier module includes a first inductor electrically connected between the regulated voltage and the first power amplifier supply voltage and the second power amplifier module includes a second inductor electrically connected between the regulated voltage and the second power amplifier supply voltage.

In some embodiments, the radio frequency system further includes a phone board, a first inductor, and a second inductor. The first inductor is disposed on the phone board and electrically connected between the regulated voltage and the first power amplifier supply voltage. The second inductor is disposed on the phone board and electrically connected between the regulated voltage and the second power amplifier supply voltage.

According to several embodiments, the radio frequency system further includes a third power amplifier module including a third power amplifier configured to amplify a third RF signal and a third error amplifier configured to generate a third power amplifier supply voltage for the third power amplifier by adjusting the voltage level of the regulated voltage based on an envelope of the third RF signal. The third power amplifier module is configured to change the voltage level of a third control voltage of the plurality of control voltages when the third power amplifier is enabled based at least in part on a voltage level of the third power amplifier supply voltage.

DETAILED DESCRIPTION OF EMBODIMENTS

The headings provided herein, if any, are for convenience only and do not necessarily affect the scope or meaning of the claimed invention.

Overview of Example Power Amplifier Systems including Envelope Tracker

Figure 1:
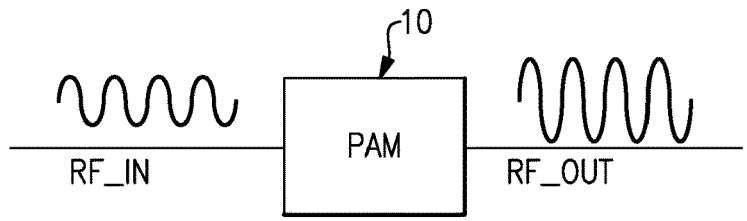
FIG. 1 is a schematic diagram of a power amplifier module for amplifying a radio frequency (RF) signal.

FIG. 1 is a schematic diagram of a power amplifier module (PAM) 10 for amplifying a radio frequency (RF) signal. The illustrated power amplifier module 10 can be configured to amplify an RF signal (RF_IN) to generate an amplified RF signal (RF_OUT). As described herein, the power amplifier module 10 can include one or more power amplifiers.

Figure 2:
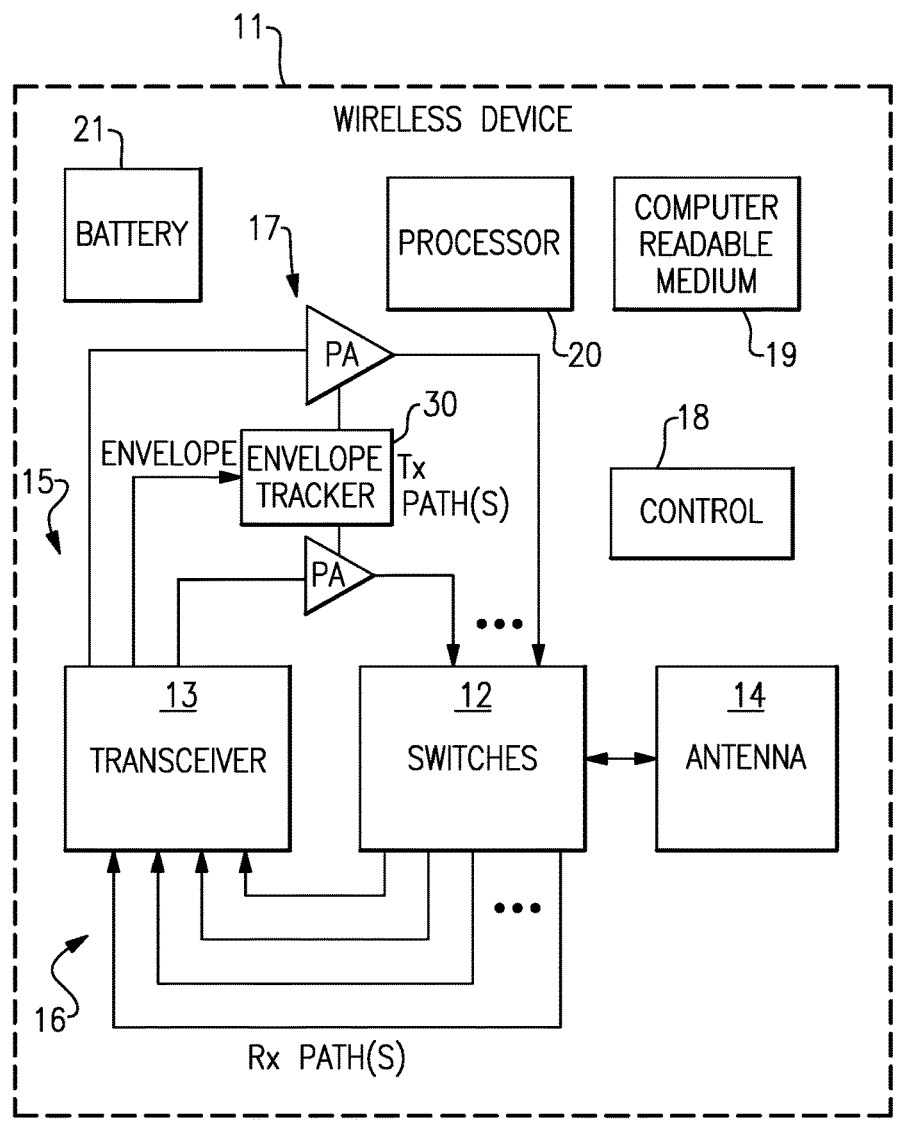
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules 10 of FIG. 1. The wireless device 11 can also include an envelope tracking system implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15 and two power amplifiers 17, the wireless device 11 can be adapted to include more or fewer transmission paths 15 and/or more or fewer power amplifiers 17.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the envelope tracker 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the envelope tracker 30, which can be used to provide a power amplifier supply voltage to one or more of the power amplifiers 17. For example, the envelope tracker 30 can be configured to change the supply voltage provided to the power amplifiers 17 based upon an envelope of the RF signal to be amplified. In the illustrated implementation, the envelope signal is provided to the envelope tracker 30 from the transceiver 13. However, other implementations are possible, including, for example, configurations in which the envelope signal is provided to the envelope tracker 30 from a baseband processor or a power management integrated circuit (PMIC). Furthermore, in certain implementations, the envelope signal can be generated from the RF signal by detecting the RF signal's envelope using any suitable envelope detector.

The envelope tracker 30 can be electrically connected to the battery 21, which can be any suitable battery for use in the wireless device 11, including, for example, a lithium-ion battery. As will be described in detail further below, by controlling the voltage provided to one or more of the power amplifiers 17, the power consumed from the battery 21 can be reduced, thereby improving the battery life of the wireless device 11.

Figure 3A:
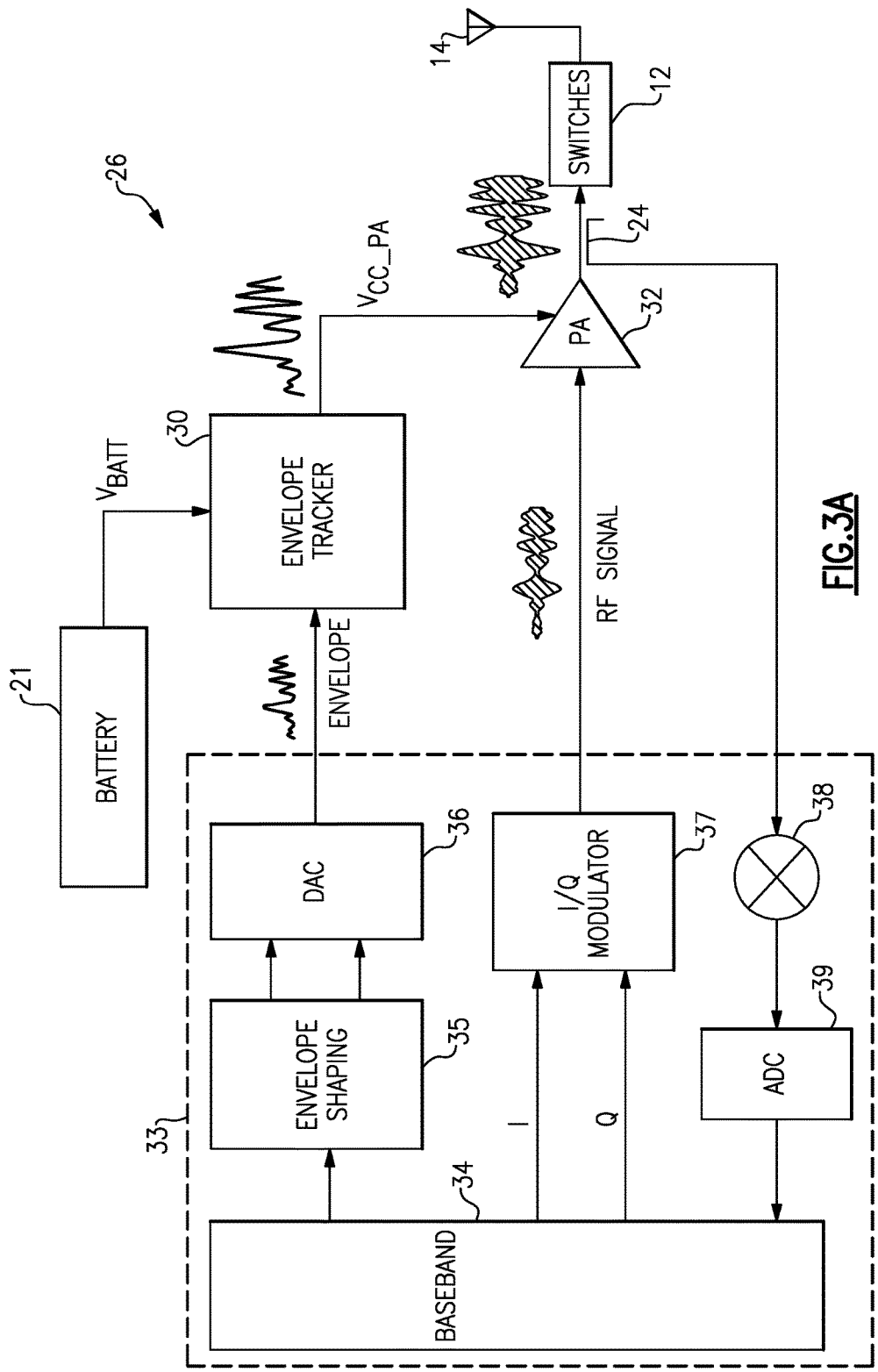
FIG. 3A is a schematic block diagram of one example of a power amplifier system including an envelope tracker.

FIG. 3A is a schematic block diagram of one example of a power amplifier system 26 including an envelope tracker 30. The illustrated power amplifier system 26 includes the switches 12, the antenna 14, the battery 21, a directional coupler 24, the envelope tracker 30, a power amplifier 32, and a transceiver 33. The illustrated transceiver 33 includes a baseband processor 34, an envelope shaping block 35, a digital-to-analog converter (DAC) 36, an I/Q modulator 37, a mixer 38, and an analog-to-digital converter (ADC) 39.

The baseband processor 34 can be used to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The envelope shaping block 35 can be used to convert envelope or amplitude data associated with the I and Q signals into shaped envelope data. Shaping the envelope data from the baseband processor 34 can aid in enhancing performance of the power amplifier system 26 by, for example, adjusting the envelope signal to optimize linearity of the power amplifier 32 and/or to achieve a desired gain compression of the power amplifier 32. In certain implementations, the envelope shaping block 35 is a digital block, and the DAC 36 is used to convert the shaped envelope data into an analog envelope signal suitable for use by the envelope tracker 30. However, in other implementations, the DAC 36 can be omitted in favor of providing the envelope tracker 30 with a digital envelope signal to aid the envelope tracker 30 in further processing of the envelope signal.

The envelope tracker 30 can receive the envelope signal from the transceiver 33 and a battery voltage $V_{BATT}$ from the battery 21, and can use the envelope signal to generate a power amplifier supply voltage $V_{CC\_PA}$ for the power amplifier 32 that changes in relation to the envelope. The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and an input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency spectrum of the sensed output signal. The downshifted signal can be provided to the ADC 39, which can convert the downshifted signal to a digital format suitable for processing by the baseband processor 34. By including a feedback path between the output of the power amplifier 32 and an input of the baseband processor 34, the baseband processor 34 can be configured to dynamically adjust the I and Q signals and/or envelope data associated with the I and Q signals to optimize the operation of the power amplifier system 26. For example, configuring the power amplifier system 26 in this manner can aid in controlling the power added efficiency (PAE) and/or linearity of the power amplifier 32.

Although the power amplifier system 26 is illustrated as include a single power amplifier, the teachings herein are applicable to power amplifier systems including multiple power amplifiers, including, for example, multi-mode and/or multi-mode power amplifier systems.

Figure 3B:
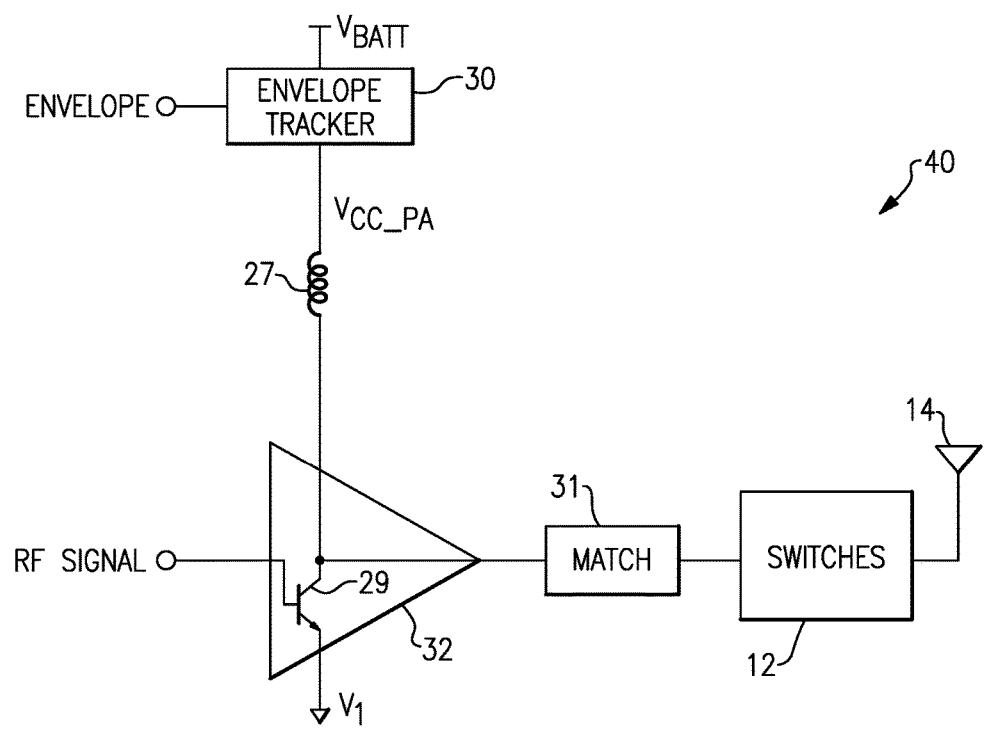
FIG. 3B is a schematic block diagram of another example of a power amplifier system including an envelope tracker.

FIG. 3B is a schematic block diagram of another example of a power amplifier system 40 including an envelope tracker 30. The illustrated power amplifier system 40 includes the envelope tracker 30, the power amplifier 32, an inductor 27, an impedance matching block 31, the switches 12, and the antenna 14. The illustrated envelope tracker 30 is configured to receive an envelope of the RF signal and to generate a power amplifier supply voltage $V_{CC\_PA}$ for the power amplifier 32 using a battery voltage $V_{BATT}$.

The illustrated power amplifier 32 includes a bipolar transistor 29 having an emitter, a base, and a collector. The emitter of the bipolar transistor 29 can be electrically connected to a power low supply voltage $V_1$, which can be, for example, a ground supply. Additionally, a radio frequency (RF) signal can be provided to the base of the bipolar transistor 29. The bipolar transistor 29 can amplify the RF signal to generate the amplified RF signal at the collector. The bipolar transistor 29 can be any suitable device. In one implementation, the bipolar transistor 29 is a heterojunction bipolar transistor (HBT).

The power amplifier 32 can be configured to provide the amplified RF signal to the switches 12. The impedance matching block 31 can be used to terminate the electrical connection between the power amplifier 32 and the switches 12, which can aid in increasing power transfer and/or reducing reflections of the amplified RF signal generated using the power amplifier 32.

The inductor 27 can be included to power the power amplifier 32 with the power amplifier supply voltage $V_{CC\_PA}$ generated by the envelope tracker 30 while choking or blocking high frequency RF signal components. The inductor 27 can include a first end electrically connected to the envelope tracker 30, and a second end electrically connected to the collector of the bipolar transistor 29.

Although FIG. 3B illustrates one implementation of the power amplifier 32, skilled artisans will appreciate that the teachings described herein can be applied to a variety of power amplifier structures, such as multi-stage power amplifiers and power amplifiers employing other transistor structures. For example, in some implementations the bipolar transistor 29 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 32 can be adapted to include additional circuitry, such as biasing circuitry.

Figure 4A:
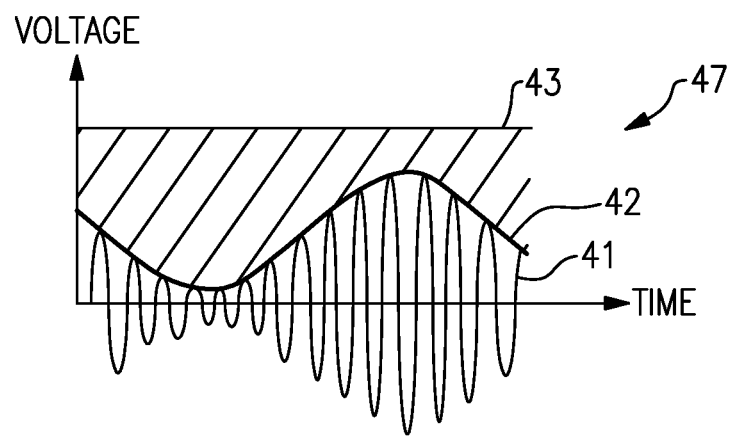
FIGS. 4A-4B show two examples of power amplifier supply voltage versus time.
Figure 4B:
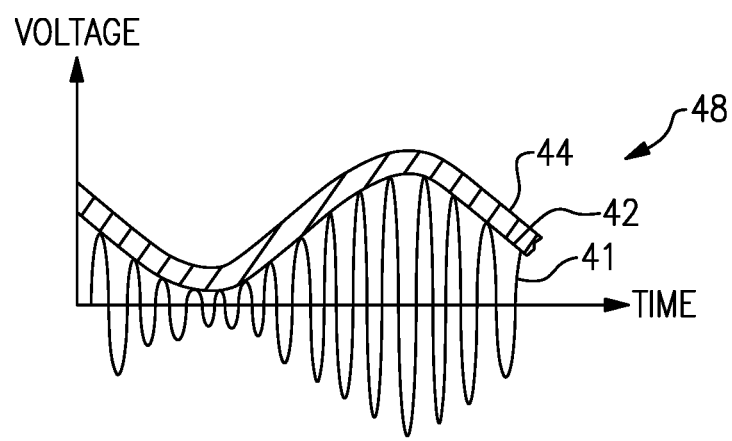

FIGS. 4A-4B show two examples of power amplifier supply voltage versus time.

In FIG. 4A, a graph 47 illustrates one example of the voltage of an RF signal 41 and a power amplifier supply voltage 43 versus time. The RF signal 41 has an envelope 42.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or other problems. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

In FIG. 4B, a graph 48 illustrates another example of the voltage of an RF signal 41 and a power amplifier supply voltage 44 versus time. In contrast to the power amplifier supply voltage 43 of FIG. 4A, the power amplifier supply voltage 44 of FIG. 4B changes in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Overview of Envelope Tracking Systems

Apparatus and methods for envelope tracking are disclosed herein. In certain implementations, an envelope tracking system for generating a power amplifier supply voltage for a power amplifier is provided. The envelope tracking system can include a buck converter and an error amplifier configured to operate in parallel to control the voltage level of the power amplifier supply voltage based on an envelope of an RF signal amplified by the power amplifier. The buck converter can be configured to convert a battery voltage into a step down or buck voltage, and the error amplifier can generate the power amplifier supply voltage by adjusting the magnitude of the step down voltage using a fast changing output current In certain implementations, the error amplifier can generate an error current than changes based on a magnitude of the error amplifier's output current, and the buck converter can control a magnitude of the buck voltage based on the error current. Controlling the buck converter using the error current can aid in improving the overall efficiency of the envelope tracking system. For example, the error amplifier can have a power efficiency that is less than a power efficiency of the buck converter but a speed that is faster than a speed of the buck converter. Thus, configuring the buck converter to control the buck voltage and thus the power amplifier supply voltage based on the error current can help improve the overall power efficiency of the envelope tracking system by reducing the amount of current that the error amplifier provides.

Figure 5:
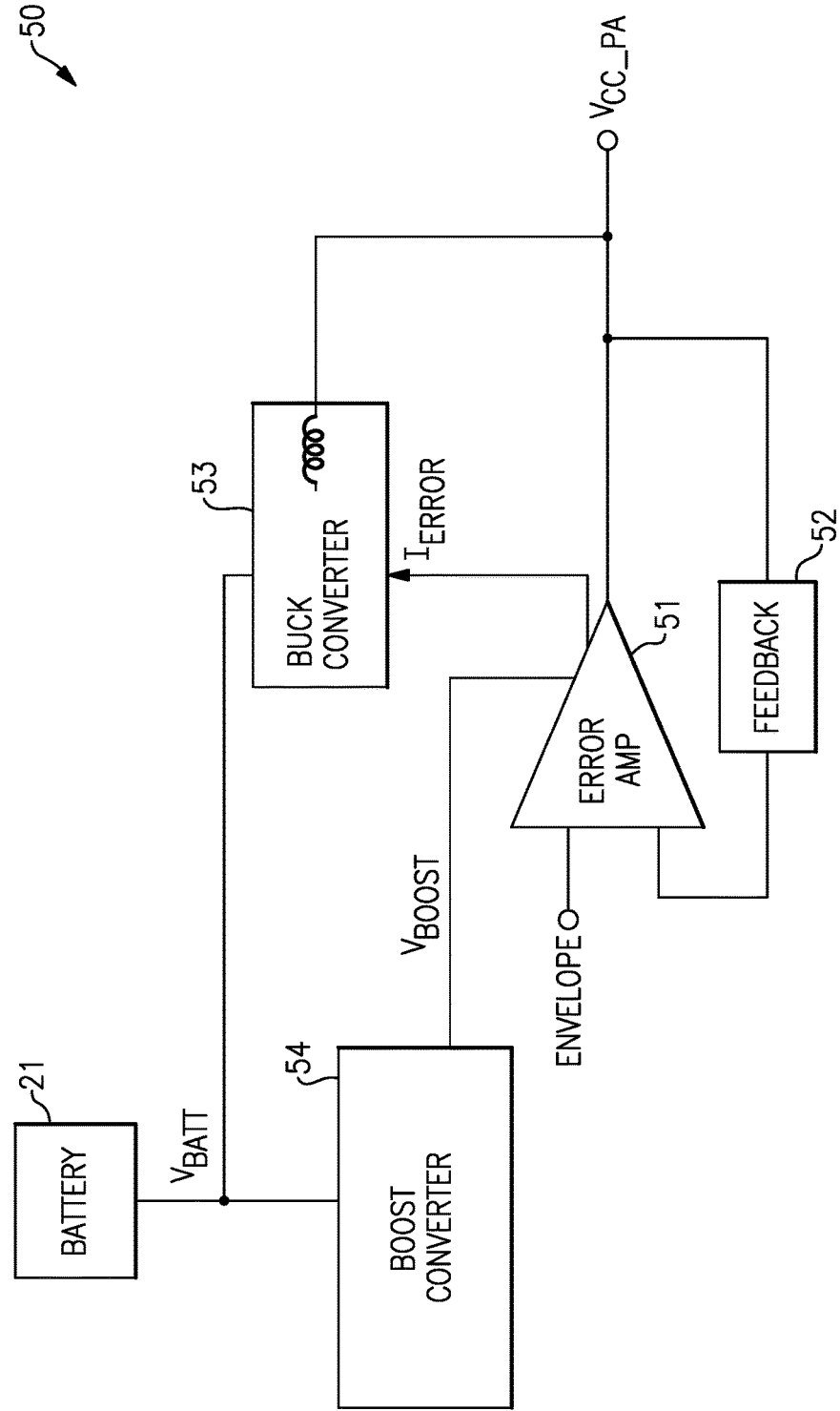
FIG. 5 is a schematic block diagram of one embodiment of an envelope tracking system.

FIG. 5 is a schematic block diagram of one embodiment of an envelope tracking system 50. The envelope tracking system 50 includes the battery 21, an error amplifier 51, a feedback circuit 52, a buck converter 53, and a boost converter 54.

The error amplifier 51 includes a first input configured to receive an envelope signal (ENVELOPE), a second input electrically connected to a first terminal of the feedback circuit 52, and an output electrically connected to the power amplifier supply voltage $V_{CC\_PA}$, to an output of the buck converter 53, and to a second terminal of the feedback circuit 52. The error amplifier 51 is configured to generate an error current $I_{ERROR}$ and to provide the error current $I_{ERROR}$ to the buck converter 53.

The feedback circuit 52 can be any suitable circuit, and can include active and/or passive circuitry. In one implementation, the feedback circuit 52 includes a resistor electrically connected between the feedback circuit's first and second terminals. However, any suitable implementation of the feedback circuit 52 can be used.

The boost converter 54 is configured to receive a battery voltage $V_{BATT}$ from the battery 21. The boost converter 54 is configured to generate a boost voltage $V_{BOOST}$, which can have a voltage level greater than a voltage level of the battery voltage $V_{BATT}$. As shown in FIG. 5, the boost voltage $V_{BOOST}$ can be used to power the error amplifier 51. Although the boost converter 54 is illustrated as generating a single boosted output voltage, in certain implementations the boost converter 54 can be configured to generate a plurality of boosted output voltages so as to provide other components or circuitry with a power supply of a desired voltage level.

The buck converter 53 is configured to receive the battery voltage $V_{BATT}$ from the battery 21 and the error current $I_{ERROR}$ from the error amplifier 51. The buck converter 53 includes an output configured to control a voltage level of the power amplifier supply voltage $V_{CC\_PA}$ by sinking or sourcing current to the power amplifier supply voltage $V_{CC\_PA}$ through an internal inductor. The buck converter 53 can be used to control the power amplifier supply voltage $V_{CC\_PA}$ to a voltage level that is less than a voltage level of the battery voltage $V_{BATT}$. As will be described in further detail below, the buck converter 53 can control the magnitude of the power amplifier supply voltage $V_{CC\_PA}$ over time based on the error current $I_{ERROR}$.

The illustrated envelope tracking system 50 includes the buck converter 53 and the error amplifier 51, which have been configured to operate in parallel to control the voltage level of the power amplifier supply voltage $V_{CC\_PA}$ based on the envelope signal. The buck converter 53 can have a power efficiency that is greater than the error amplifier's power efficiency, but a tracking speed that is a slower that the error amplifier's tracking speed. Thus, the error amplifier 51 can be used to provide tracking of high frequency components of the envelope signal while the buck converter 53 can be used to provide tracking of low frequency components of the envelope signal. In the illustrated configuration the error amplifier 51 is powered using the boost voltage $V_{BOOST}$, and thus the error amplifier 51 can also be used to control the voltage level of the power amplifier supply voltage $V_{CC\_PA}$ to be above the battery voltage $V_{BATT}$.

In the configuration shown in FIG. 5, the error amplifier 51 provides the error current $I_{ERROR}$ to the buck converter 53 to aid the buck converter 53 in tracking the envelope signal.

The error current $I_{ERROR}$ can indicate a difference between a current or present voltage level of the power amplifier supply voltage $V_{CC\_PA}$ and a desired voltage level of the power amplifier supply voltage $V_{CC\_PA}$. Since the error amplifier 51 can have a power efficiency that is less than a power efficiency of the buck converter 53 but a speed that is faster than a speed of the buck converter 53, configuring the buck converter 53 to control the power amplifier supply voltage $V_{CC\_PA}$ based on the error current $I_{ERROR}$ can help improve the overall power efficiency of the envelope tracking system 50 by reducing the amount of current that the error amplifier 51 provides. For example, the error current $I_{ERROR}$ can change as the error amplifier 51 sinks or sources current onto the power amplifier supply voltage $V_{CC\_PA}$, and the buck converter 53 can control the voltage level of the power amplifier supply voltage $V_{CC\_PA}$ over time so as to reduce the magnitudes of the error current $I_{ERROR}$ and the output current of the error amplifier 51.

As described earlier, the boost converter 54 can generate the boost voltage $V_{BOOST}$, which can have a voltage magnitude greater than that of the battery voltage $V_{BATT}$. Including the boost converter 54 in the envelope tracking system 50 can allow the error amplifier 51 to control the power amplifier supply voltage $V_{CC\_PA}$ to a voltage level above the battery voltage $V_{BATT}$. Configuring the envelope tracking system 50 in this manner can allow a power amplifier that is powered using the envelope tracking system 50 to drive a relatively large load line impedance. For example, a power amplifier driving a large load line impedance can have relatively large voltage swings at the output of the power amplifier when the power amplifier is amplifying a relative large RF input signal. Thus, configuring the envelope tracking system 50 to control the power amplifier supply voltage $V_{CC\_PA}$ above the battery voltage $V_{BATT}$ can increase the maximum load line impedance that the power amplifier can drive by permitting the output signal of the power amplifier to exceed the battery voltage $V_{BATT}$ without clipping or otherwise distorting the power amplifier's output signal.

The envelope tracking system 50 can provide numerous advantages over other envelope tracking schemes. For example, the envelope tracking system 50 can provide relatively robust envelope tracking while providing high power efficiency. Additionally, the envelope tracking system 50 can have a relatively small component count, including, for example, a relatively small number of external components such as discrete inductors. In certain implementations, the envelope tracking system 50 is integrated on a common module such as a multi-chip module (MCM) with a power amplifier. However, other configurations are possible.

Figure 6:
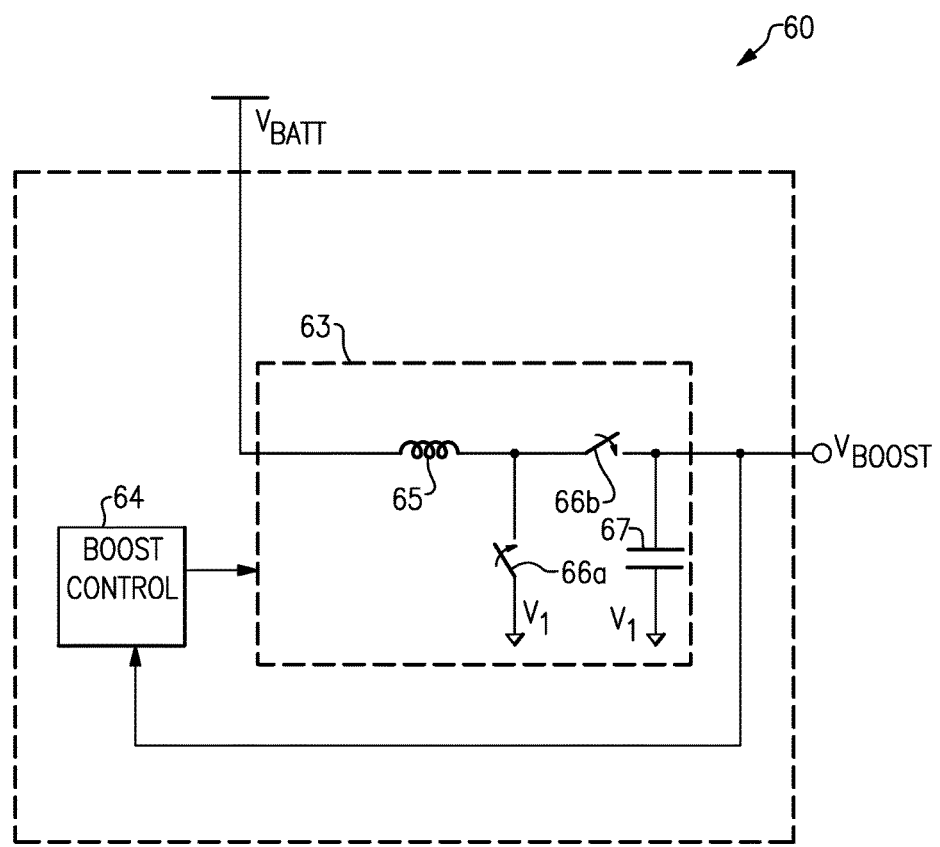
FIG. 6 is a circuit diagram of one embodiment of a boost converter.

FIG. 6 is a circuit diagram of one embodiment of a boost converter 60, which can be used, for example, in the envelope tracking system 50 of FIG. 5. The boost converter 60 includes a boost circuit 63 and a boost control block 64. The boost circuit 63 is configured to receive a battery voltage $V_{BATT}$ and to boost or increase a voltage magnitude of the battery voltage $V_{BATT}$ to generate a boost voltage $V_{BOOST}$. The boost control block 64 includes a feedback input configured to receive the boost voltage $V_{BOOST}$ and a control output for controlling the boost circuit 63.

The boost circuit 63 includes an inductor 65, first and second switches 66a, 66b, and a bypass capacitor 67. The inductor 65 includes a first end electrically connected to the battery voltage $V_{BATT}$ and a second end electrically connected to a first end of the first switch 66a and to a first end of the second switch 66b. The first switch 66a further includes a second end electrically connected to the first or power low supply voltage $V_1$, which can be, for example, a ground supply. The second switch 66b further includes a second end electrically connected to the boost voltage $V_{BOOST}$ and to a first end of the capacitor 67. The bypass capacitor 67 further includes a second end electrically connected to the power low supply voltage $V_1$. The bypass capacitor 67 can be used to filter the boost voltage $V_{BOOST}$. In certain implementation the bypass capacitor 67 can be placed or positioned a relatively short distance from the boost converter's load.

The boost control block 64 can be configured to control the boost circuit 63 so as to generate the boost voltage $V_{BOOST}$. For instance, when the boost circuit 63 is operating continuously, the boost control block 64 can generate the boost voltage $V_{BOOST}$ by regularly switching the state of the first and second switches 66a, 66b between a configuration associated with a first boost phase of the boost circuit 63 and a configuration associated with a second boost phase of the boost circuit 63. For example, during the first boost phase of the boost circuit 63, the boost control block 64 can open the second switch 66b and close the first switch 66a so as to increase the magnetic field of the inductor 65 by providing a current from the battery voltage $V_{BATT}$ to the power low supply voltage $V_1$ through the inductor 65 and the first switch 66a. Additionally, during the second boost phase of the boost circuit 63, the boost control block 64 can close the second switch 66b and open the first switch 66a such that the magnetic field of the inductor 65 generates a current from the battery voltage $V_{BATT}$ to the boost voltage $V_{BOOST}$ through the inductor 65 and the second switch 66b.

Although the boost circuit 63 has been described as being operated over two phases when generating the boost voltage $V_{BOOST}$, the boost circuit 63 can be configured to operate using additional phases. For instance, the boost circuit 63 can be configured to operate intermittently using the boost control block 64 by switching the boost circuit 63 between the first boost phase, the second boost phase, and a third boost phase associated with opening the first and second switches 66a, 66b.

Although FIG. 6 illustrate one example of a boost converter 60 suitable for use in the envelope tracking systems described herein, other configurations of the boost converter 60 can be used, including, for example, configurations in which the first and second switches 66a, 66b are connected and/or operated in other ways.

Figure 7:
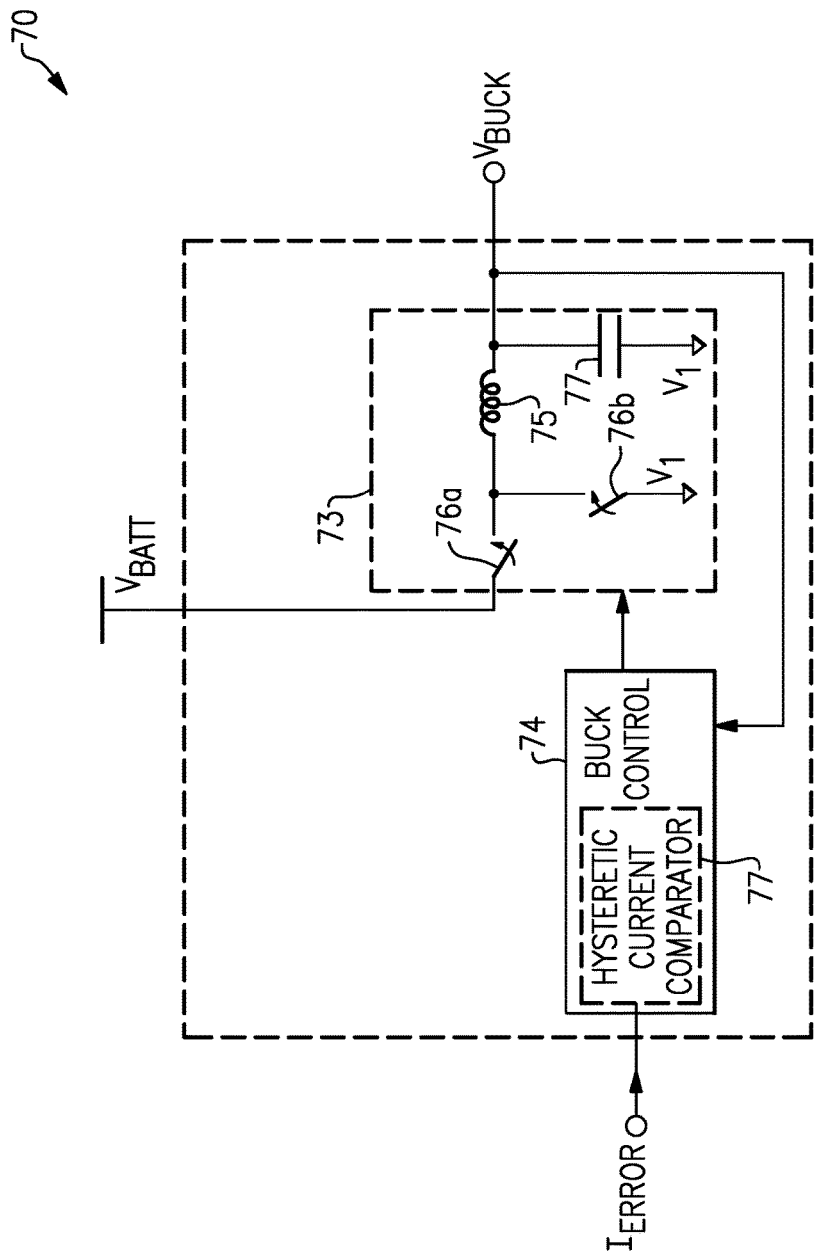
FIG. 7 is a circuit diagram of one embodiment of a buck converter.

FIG. 7 is a circuit diagram of one embodiment of a buck converter 70, which can be used, for example, in the envelope tracking system 50 of FIG. 5. The buck converter 70 includes a buck circuit 73 and a buck control block 74. The buck circuit 73 is configured to receive a battery voltage $V_{BATT}$ and to generate a buck voltage $V_{BUCK}$, which can have a voltage magnitude less than that of the battery voltage $V_{BATT}$. The buck control block 74 includes a feedback input configured to receive the buck voltage $V_{BUCK}$, an error input for receiving an error current $I_{ERROR}$, and a control output for controlling the buck circuit 73. As described above with reference to FIG. 5, the buck converter 70 can be electrically connected in parallel with an error amplifier to generate a power amplifier supply voltage. Accordingly, in certain implementations the output of the buck converter 70 configured to generate the buck voltage $V_{BUCK}$ is electrically connected to the power amplifier supply voltage.

The buck circuit 73 includes an inductor 75, first and second switches 76a, 76b, and a bypass capacitor 77. The first switch 76a includes a first end electrically connected to the battery voltage $V_{BATT}$ and a second end electrically connected to a first end of the second switch 76b and to a first end of the inductor 75. The second switch 76b further includes a second end electrically connected to the power low supply voltage $V_1$. The inductor 76 further includes a second end electrically connected to the buck voltage $V_{BUCK}$ and to a first end of the bypass capacitor 77. The bypass capacitor 77 further includes a second end electrically connected to the power low supply voltage $V_1$. The bypass capacitor 77 can be used to filter the buck voltage $V_{BUCK}$. In certain implementation the bypass capacitor 77 can be placed relatively close or near to the buck converter's load.

The buck control block 74 can be configured to control the buck circuit 73 so as to generate the buck voltage $V_{BUCK}$. For instance, when the buck circuit 73 is operating continuously, the buck control block 74 can generate the buck voltage $V_{BUCK}$ by regularly switching the state of the first and second switches 76a, 76b between a configuration associated with a first buck phase of the buck circuit 73 and a configuration associated with a second buck phase of the buck circuit 73. For example, during the first buck phase of the buck circuit 73, the buck control block 74 can open the second switch 76b and close the first switch 76a so as to charge the magnetic field of the inductor 75 by providing a current from the battery voltage $V_{BATT}$ to the buck voltage $V_{BUCK}$ through the inductor 75 and the first switch 76a. Additionally, during the second buck phase of the buck circuit 73, the buck control block 74 can be configured to close the second switch 76b and to open the first switch 76a such that the magnetic field of the inductor 75 generates a current from the power low supply voltage $V_1$ to the buck voltage $V_{BUCK}$ through the second switch 76b and the inductor 75.

Although the buck circuit 73 has been described as being operated over two phases when generating the buck voltage $V_{BUCK}$, the buck circuit 73 can be configured to operate using additional phases. For instance, the buck circuit 73 can be configured to operate intermittently with the buck control block 74 configured to switch the buck circuit 73 between the first buck phase, the second buck phase, and a third buck phase associated with opening each of the first and second switches 76a, 76b.

The buck control block 74 includes a hysteretic current comparator 77, which can be used to control the buck circuit 73 based on the error current $I_{ERROR}$. As was described earlier with respect to FIG. 5, the error current $I_{ERROR}$ can change in relation to an output current of an error amplifier. The hysteretic current comparator 77 can be used to control a magnitude of the buck voltage $V_{BUCK}$ based on the error current $I_{ERROR}$ so as to reduce an output current of the error amplifier and to improve the overall efficiency of the envelope tracking system. In certain implementations, the error current $I_{ERROR}$ is a differential error current, and the hysteretic current comparator 77 is configured to compare a positive or non-inverted current component of the error current $I_{ERROR}$ to a negative or inverted current component of the error current $I_{ERROR}$, and to control the buck voltage $V_{BUCK}$ based on the result. Additional details of the hysteretic current comparator 77 can be as described further below.

Although FIG. 7 illustrate one example of a buck converter 70 suitable for use in the envelope tracking systems described herein, other buck converter configurations can be used.

Figure 8:
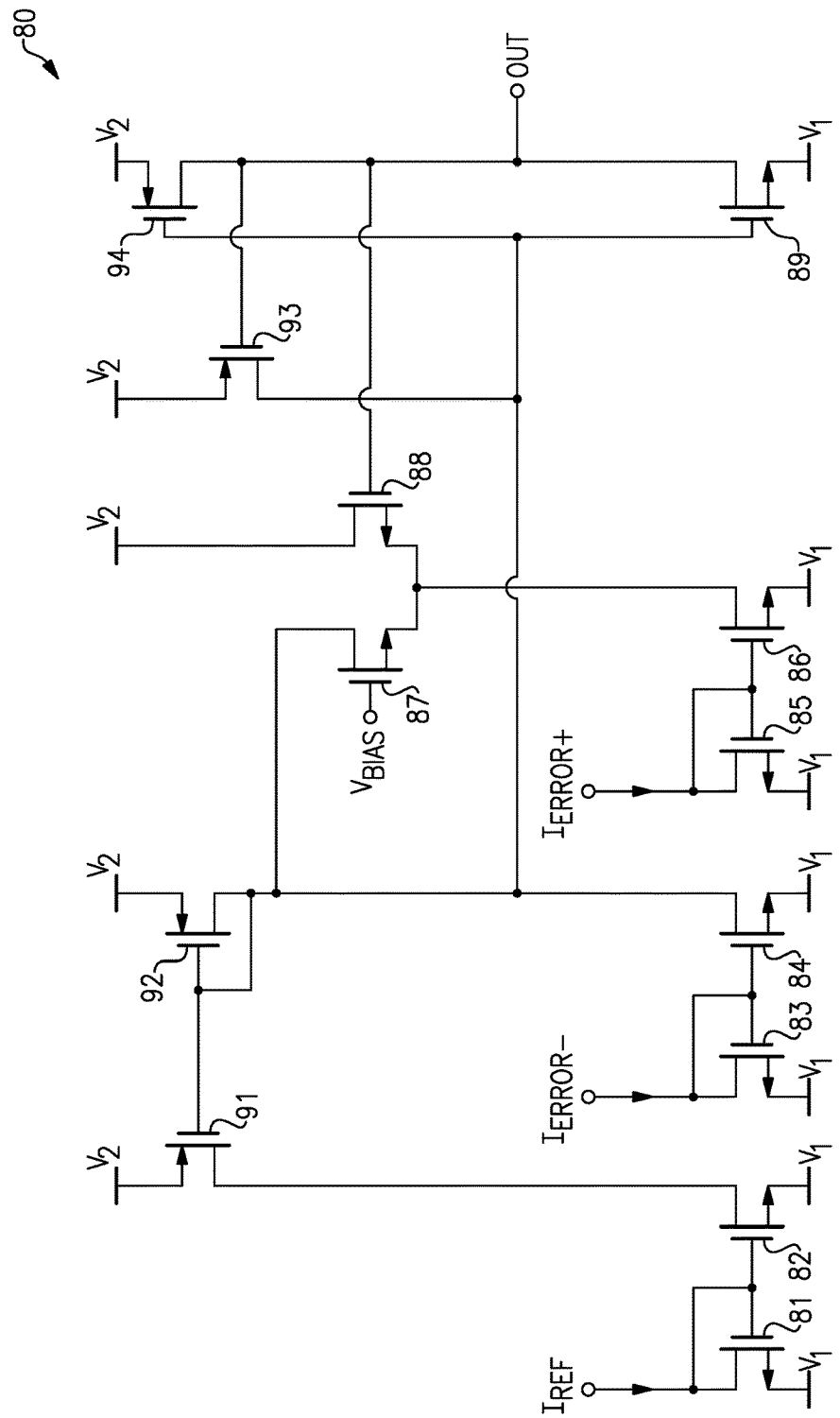
FIG. 8 is a circuit diagram of one embodiment of a hysteretic current comparator.

FIG. 8 is a circuit diagram of one embodiment of a hysteretic current comparator 80, which can be used, for example, in the buck converter 70 of FIG. 7. The hysteretic current comparator 80 includes first to ninth n-type field-effect transistors (NFETs) 81-89 and first to fourth p-type field-effect transistors (PFETs) 91-94. The hysteretic current comparator 80 is configured to receive a reference current $I_{REF}$ and a differential error current $I_{ERROR+}$, $I_{ERROR-}$, and to generate an output signal OUT that can be used to control a buck converter. The differential error current $I_{ERROR+}$, $I_{ERROR-}$ can correspond to a difference between a positive or non-inverted error current $I_{ERROR+}$ and a negative or inverted error current $I_{ERROR-}$.

The first NFET 81 includes a drain configured to receive the reference current $I_{REF}$. The drain of the first NFET 81 is electrically connected to a gate of the first NFET 81 and to a gate of the second NFET 82. The second NFET 82 further includes a drain electrically connected to a drain of the first PFET 91. The first and second NFETs 81, 82 each include a source electrically connected to the power low supply voltage $V_1$, which can be, for example, a ground supply. The third NFET 83 includes a drain configured to receive the negative error current $I_{ERROR-}$. The drain of the third NFET 83 is electrically connected to a gate of the third NFET 83 and to a gate of the fourth NFET 84. The fourth NFET 84 further includes a drain electrically connected to a gate of the first PFET 91, to a gate and a drain of the second PFET 92, to a drain of the seventh NFET 87, to a drain of the third PFET 93, to a gate of the ninth NFET 89, and to a gate of the fourth PFET 94. The third and fourth NFETs 83, 84 each further include a source electrically connected to the power low supply voltage $V_1$. The first and second PFETs 91, 92 each further include a source electrically connected to a second or power high supply voltage $V_2$. In certain implementations the power high supply voltage $V_2$ is a boost voltage generated by a boost converter. However, in other implementations the power high supply voltage $V_2$ can be other voltages, such as a battery voltage.

The fifth NFET 85 includes a drain configured to receive the positive error current $I_{ERROR+}$. The drain of the fifth NFET 85 is electrically connected to a gate of the fifth NFET 85 and to a gate of the sixth NFET 86. The sixth NFET 86 further includes a drain electrically connected to a source of the seventh NFET 87 and to a source of the eighth NFET 88. The fifth and sixth NFETs 85, 86 each further include a source electrically connected to the power low supply voltage $V_1$. The seventh NFET 87 further includes a gate electrically connected to a bias voltage $V_{BIAS}$. In one implementation, the bias voltage $V_{BIAS}$ is biased with a voltage level selected to be in the range of about 2.2 V to about 3.6 V. However, persons of ordinary skill in the art will readily ascertain other suitable voltage values, including, for example, voltage values associated with a particular application and/or manufacturing process.

The eighth NFET 88 further includes a drain electrically connected to the power high supply voltage $V_2$, and a gate electrically connected to a gate of the third PFET 93, to a drain of the fourth PFET 94, and to a drain of the ninth NFET 89 at a node configured to generate the output signal OUT. The ninth NFET 89 further includes a source electrically connected to the power low supply voltage $V_1$, and the fourth PFET 94 further includes a source electrically connected to the power high supply voltage $V_2$.

The output signal OUT can change in relation to the differential error current $I_{ERROR+}$, $I_{ERROR-}$. For example, when the positive error current $I_{ERROR+}$ is relatively large, the voltage of the gates of the ninth NFET 89 and the fourth PFET 94 can be pulled high and the ninth NFET 89 and the fourth PFET 94 can control the output signal OUT to be logically low. Additionally, when the negative error current $I_{ERROR-}$ is relatively large, the voltage of the gates of the ninth NFET 89 and the fourth PFET 94 can be pulled low and the ninth NFET 89 and the fourth PFET 94 can control the output signal OUT to be logically high. Accordingly, the output signal OUT can track the differential error current $I_{ERROR+}$, $I_{ERROR-}$. Although the illustrated configuration illustrates one configurations of the output signal OUT, the teachings herein are applicable to configurations in which the polarity of the output signal OUT is reversed.

The illustrated error amplifier 80 employs hysteresis to prevent the output signal OUT from changing state in response to relatively small fluctuations of the differential error current $I_{ERROR+}$, $I_{ERROR-}$. For example, the eighth NFET 88 and the third PFET 93 can provide hysteresis.

Although FIG. 8 illustrates one example of a hysteretic current comparator 80 for use in the buck converter 70 of FIG. 7, other implementations of the hysteretic current comparator 80 can be used, including arrangements having transistors arranged in other ways. Additionally, in some implementations the hysteretic current comparator 80 can be omitted in favor of controlling the buck converter in other ways, such as by using a low pass filter.

Figure 9:
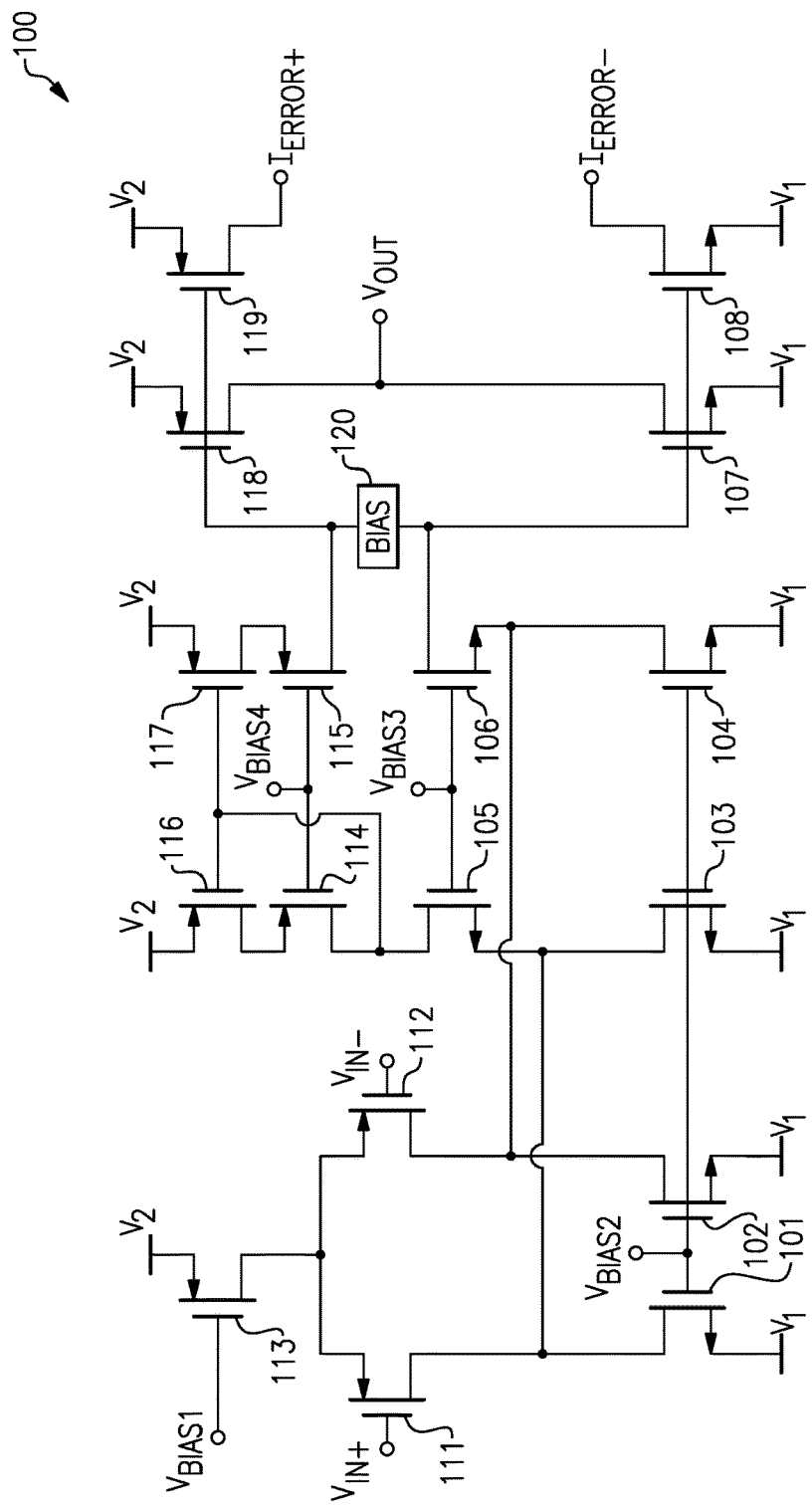
FIG. 9 is a circuit diagram of one embodiment of an error amplifier.

FIG. 9 is a circuit diagram of one embodiment of an error amplifier 100, which can be used, for example, in the envelope tracking system 50 of FIG. 5. The error amplifier 100 includes first to eighth NFETs 101-108, first to ninth PFETs 111-119, and a bias circuit 120. The error amplifier 100 is configured to receive a differential input voltage $V_{IN+}$, $V_{IN-}$, to generate an output voltage $V_{OUT}$, and to generate a differential error current $I_{ERROR+}$, $I_{ERROR-}$. The differential input voltage $V_{IN+}$, $V_{IN-}$ can be associated with a difference between a positive or first input voltage $V_{IN+}$ and a negative or second input voltage $V_{IN-}$.

The first PFET 111 includes a gate configured to receive the positive input voltage $V_{IN+}$, and a source electrically connected to a source of the second PFET 112 and to a drain of the third PFET 113. The first PFET 111 further includes a drain electrically connected to a drain of the first NFET 101, to a drain of the third NFET 103, and to a source of the fifth NFET 105. The second PFET 112 further includes a gate configured to receive the negative input voltage $V_{IN-}$, and a drain electrically connected to a drain of the second NFET 102, to a drain of the fourth NFET 104, and to a source of the sixth NFET 106. The third PFET 113 further includes a gate configured to receive a first bias voltage $V_{BIAS1}$, and a source electrically connected to the power high supply voltage $V_2$. The first NFET 101 further includes a gate electrically connected to a gate of the second NFET 102, to a gate of the third NFET 103, and to a gate of the fourth NFET 104 at a node configured to receive a second bias voltage $V_{BIAS2}$. The first to fourth NFETs 101-104 each further include a source electrically connected to the power low supply voltage $V_1$.

The fifth NFET 105 further includes a gate electrically connected to a gate of the sixth NFET 106 at a node configured to receive a third bias voltage $V_{BIAS3}$. The fifth NFET 105 further includes a drain electrically connected to a gate of the sixth PFET 116, to a gate of the seventh PFET 117, and to a drain of the fourth PFET 114. The fourth PFET 114 further includes a gate electrically connected to a gate of the fifth PFET 115 at a node configured to receive a fourth bias voltage $V_{BIAS4}$. The fourth PFET 114 further includes a source electrically connected to a drain of the sixth PFET 116. The sixth and seventh PFETs 116, 117 each further include a source electrically connected to the power high supply voltage $V_2$. The seventh PFET 117 further includes a drain electrically connected to a source of the fifth PFET 115. The fifth PFET 115 further includes a drain electrically connected to a gate of the eighth PFET 118, to a gate of the ninth PFET 119, and to a first terminal of the bias circuit 120.

The eighth PFET 118 further includes a drain electrically connected to a drain of the seventh NFET 107 and configured to generate the output voltage $V_{OUT}$. The ninth PFET 119 further includes a drain configured to generate the positive error current $I_{ERROR+}$. The eighth and ninth PFETs 118, 119 each further include a source electrically connected to the power high supply voltage $V_2$. The eighth NFET 108 further includes a drain configured to generate the negative error current $I_{ERROR-}$, and a gate electrically connected to a gate of the seventh NFET 107, to a drain of the sixth NFET 106, and to a second terminal of the bias circuit 120. The seventh and eighth NFETs 107, 108 each further include a source electrically connected to the power low supply voltage $V_1$.

The bias circuit 120 can be any suitable bias circuit. For example, in one implementation the bias circuit 120 includes a PFET and an NFET electrically connected in parallel with the channels of the PFET and the NFET disposed between the first and second terminals of the bias circuit 120. However, other configurations of the bias circuit 120 can be used.

The error amplifier 100 can be used to amplify the differential input voltage $V_{IN+}$, $V_{IN-}$ to generate the output voltage $V_{OUT}$. For example, the first and second PFETs 111, 112 can operate as a differential transistor pair, and the first to sixth NFETs 101-106 and the fourth to seventh PFETs 114-117 can operate as a folded cascode amplification structure. Additionally, the seventh NFET 107 and the eighth PFET 118 can operate as an output stage of the error amplifier 100.

As shown in FIG. 9, the eighth NFET 108 and the ninth PFET 119 can be configured to receive the gate voltages of the seventh NFET 107 and the eighth PFET 118, respectively. Since the seventh NFET 107 and the eighth PFET 118 can operate as an output stage of the error amplifier 100, electrically connecting the gates of the eighth NFET 108 and the ninth PFET 119 in this manner can be used to generate a differential error current $I_{ERROR+}$, $I_{ERROR-}$ that tracks the output current of the error amplifier 100. In certain implementations, the eighth NFET 108 is a replica transistor of the seventh NFET 107, and the ninth PFET 119 is a replica transistor of the eighth PFET 118. For example, in embodiment the widths of the eighth NFET 108 and the ninth PFET 119 are selected to be between about 100 times to about 200 times smaller than the widths of the seventh NFET 107 and the eighth PFET 118, respectively. However, persons having ordinary skill in the art will readily ascertain other suitable widths.

The first to fourth bias voltages $V_{BIAS1}$-$V_{BIAS4}$ can be any suitable voltages. In one implementation, the first bias voltage $V_{BIAS1}$ has a voltage level selected to be in the range of about 2 V to about 3.8 V, the second bias voltage $V_{BIAS2}$ has a voltage level selected to be in the range of about 0.6 V to about 1 V, the third bias voltage $V_{BIAS3}$ has a voltage level selected to be in the range of about 2.2V to about 3.6 V, and the fourth bias voltage $V_{BIAS4}$ has a voltage level selected to be in the range of about 2.4V to about 3.8 V. However, other voltage levels will be readily ascertained by persons having ordinary skill in the art, including, for example, voltage levels associated with a particular application and/or process.

Although FIG. 9 illustrates one example of an error amplifier suitable for use with the envelope tracking systems described herein, other error amplifier configurations can be used in accordance with the envelope tracking schemes described herein.

Figure 10:
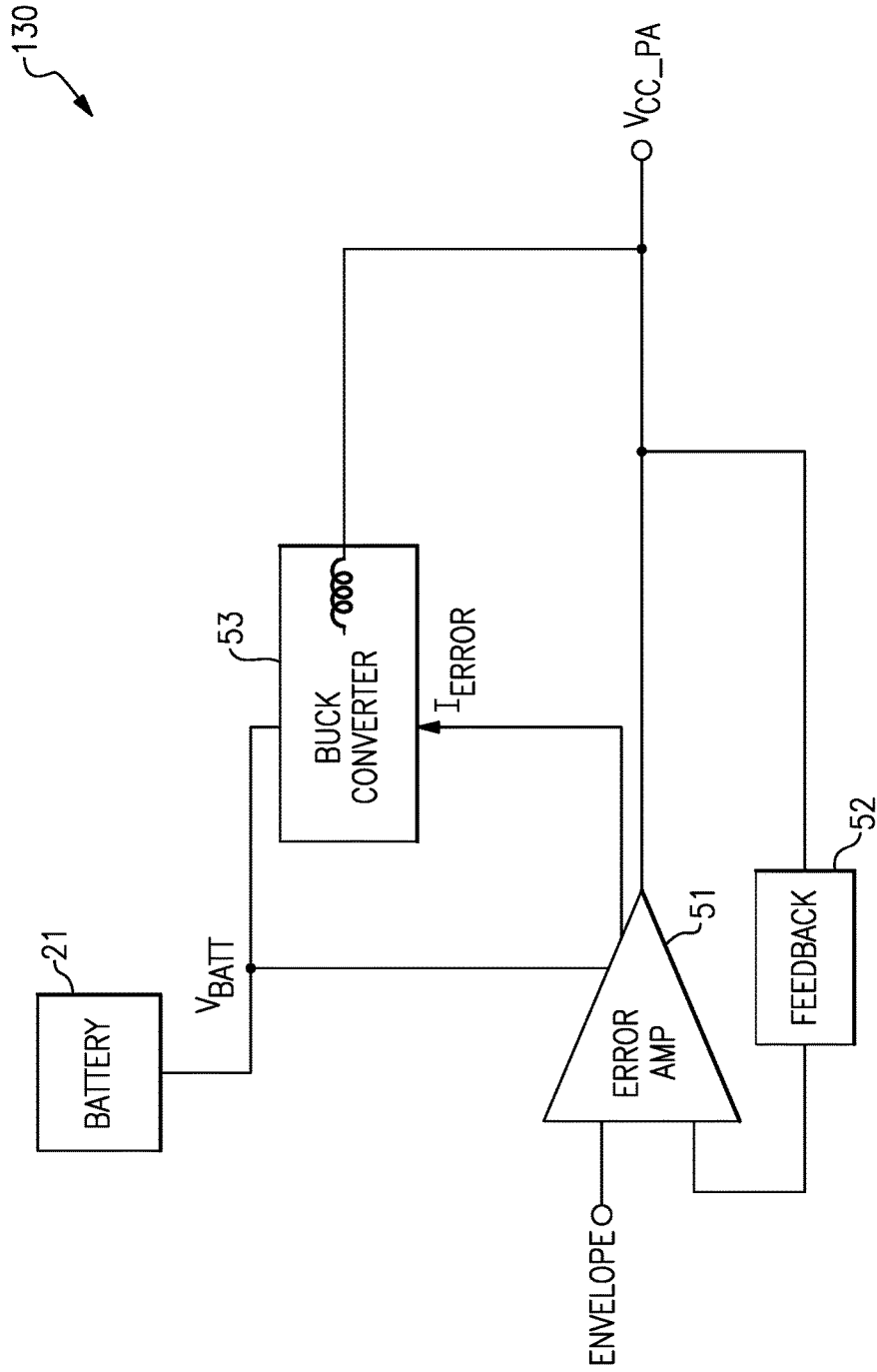
FIG. 10 is a schematic block diagram of another embodiment of an envelope tracking system.

FIG. 10 is a schematic block diagram of another embodiment of an envelope tracking system 130. The envelope tracking system 130 includes the battery 21, the error amplifier 51, the feedback circuit 52, and the buck converter 53.

The envelope tracking system 130 of FIG. 10 is similar to the envelope tracking system 50 of FIG. 5, except that the envelope tracking system 130 of FIG. 10 illustrates a configuration in which the boost converter 54 of FIG. 5 has been omitted in favor of powering the error amplifier 51 using the battery voltage $V_{BATT}$. Configuring the envelope tracking system 130 in this manner can reduce the envelope tracking system's complexity by decreasing component count, such as a number of inductors. However, configuring the envelope tracking system 130 in this manner can also reduce the maximum voltage level that the envelope tracking system 130 can control the power amplifier supply voltage $V_{CC\_PA}$ to. For example, as described earlier with respect to FIG. 5, when a power amplifier drives a relatively large load impedance, the power amplifier can use a relatively large maximum power amplifier supply voltage. Accordingly, the envelope tracking system 130 can be suitable for powering one or more power amplifiers that drive a relatively small load line impedance, such as a load line impedance less than or equal to 5Ω. Additional details of the power amplifier system 130 can be similar to those described earlier with respect to the power amplifier system 50 of FIG. 5.

Figure 11:
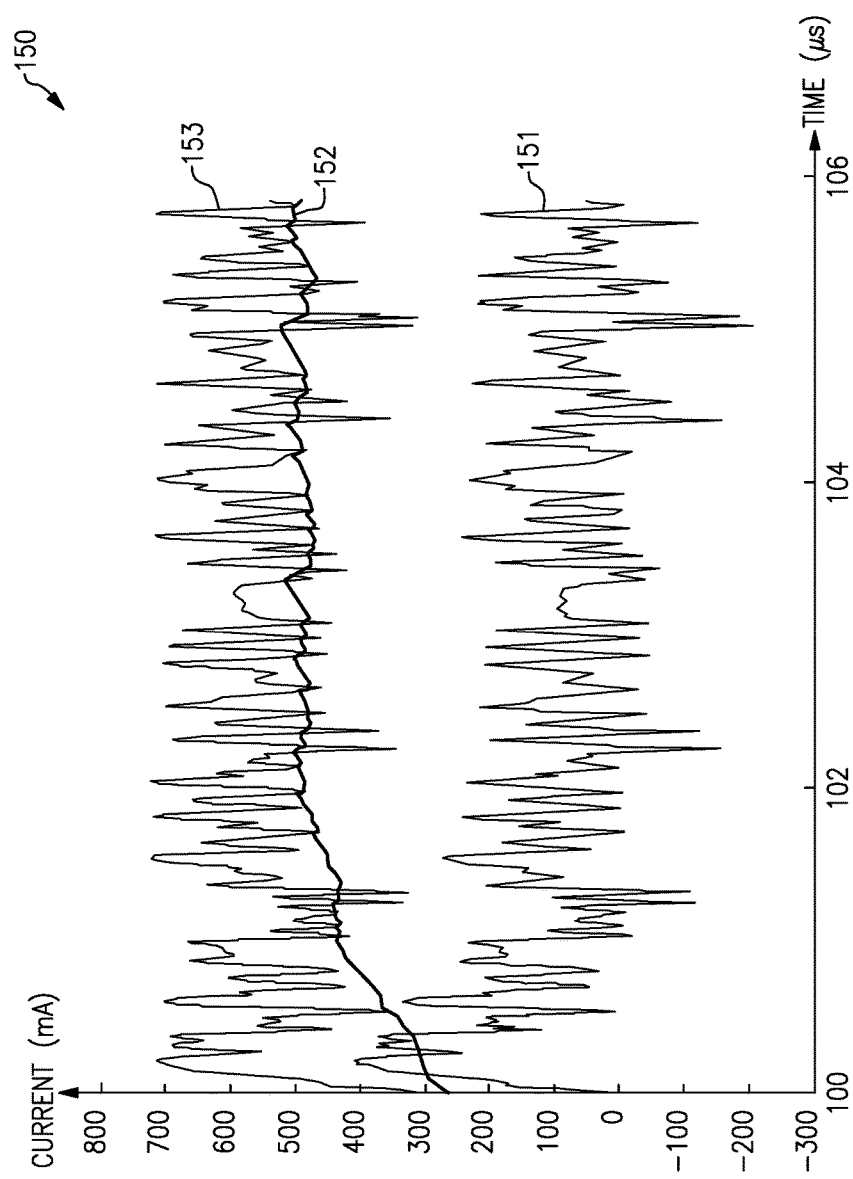
FIG. 11 shows one example of a graph of current versus time for the envelope tracking system of FIG. 5.

FIG. 11 shows one example of a graph 150 of current versus time for the envelope tracking system 50 of FIG. 5. The graph 150 includes a first plot 151 of current versus time, a second plot 152 of current versus time, and a third plot 153 of current versus time. The graph 150 can correspond to one example of current waveforms for certain envelope tracking systems described herein, such as the envelope tracking system 50 of FIG. 5. For example, the first plot 151 can correspond to an output current of the error amplifier 51 versus time, the second plot 152 can correspond to an output current of the buck converter 53 versus time, and the third plot 153 can correspond to a current provided to a power amplifier, which can be equal to the sum of the output current of the error amplifier 51 and the output current of the buck converter 53. As shown in the graph 150, by providing the error current signal $I_{ERROR}$ to the buck converter 51, the buck converter 51 can be configured to generate a larger portion of the current provided to a power amplifier over time relative to the portion of current provided by the error amplifier 51. Since the buck converter 53 can have a higher power efficiency than the error amplifier 51, configuring the envelope tracking system in this way can improve power efficiency.

Figure 12:
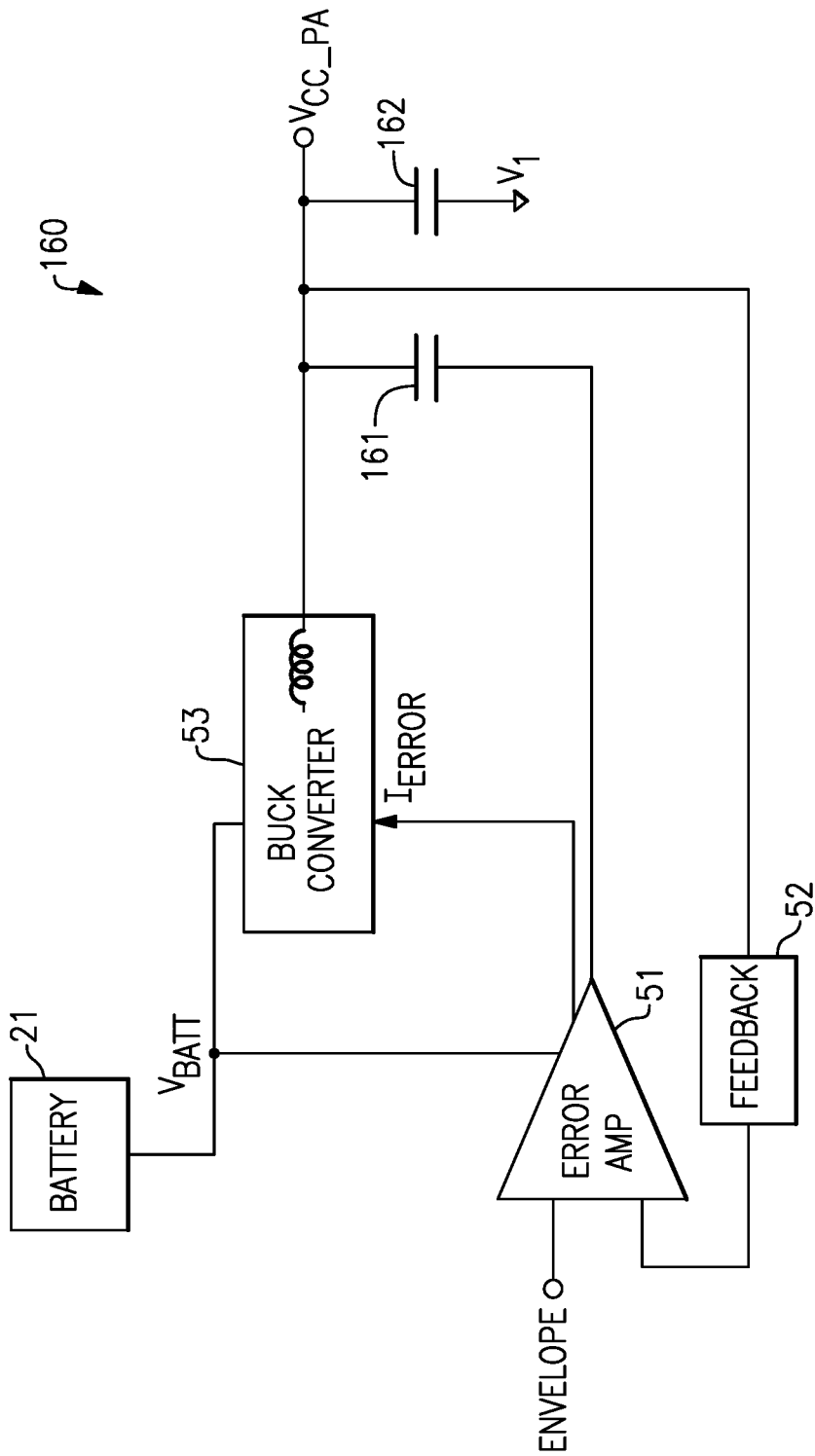
FIG. 12 is a schematic block diagram of another embodiment of an envelope tracking system.

FIG. 12 is a schematic block diagram of another embodiment of an envelope tracking system 160. The envelope tracking system 160 includes the battery 21, the error amplifier 51, the feedback circuit 52, the buck converter 53, an AC coupling capacitor 161, and a bypass capacitor 162.

The envelope tracking system 160 of FIG. 12 is similar to the envelope tracking system 130 of FIG. 10, except that the envelope tracking system 160 of FIG. 12 further includes the AC coupling capacitor 161 and the bypass capacitor 162. The bypass capacitor 162 is electrically connected between the power amplifier supply voltage $V_{CC\_PA}$ and the power low supply voltage $V_1$, and can be included to reduce output supply noise. Additionally, the envelope tracking system 160 includes the AC coupling capacitor 161, which has been electrically connected between the output of the error amplifier 51 and the power amplifier supply voltage $V_{CC\_PA}$.

Inserting the AC coupling capacitor 161 in an electrical path between the error amplifier's output and the power amplifier supply voltage $V_{CC\_PA}$ allows the error amplifier 51 to be powered using the battery voltage $V_{BATT}$ while permitting the error amplifier 51 to control the power amplifier supply voltage $V_{CC\_PA}$ to voltage levels above the battery voltage $V_{BATT}$. Accordingly, the illustrated envelope tracking system 160 can be used in applications associated with a relatively high maximum voltage level of the power amplifier supply voltage $V_{CC\_PA}$, such as configurations in which a power amplifier drives a relatively large load impedance and has a relatively large output voltage swing.

In certain implementations, the envelope tracking system 160 is integrated on a common module with a power amplifier. For example, in one embodiment, a multi-chip-module (MCM) includes a power amplifier die and an envelope tracking die attached to a common module substrate. However, other implementations are possible, such as implementations in which the envelope tracking system 160 is implemented on an envelope tracking module that is separate from a power amplifier module.

Figure 13:
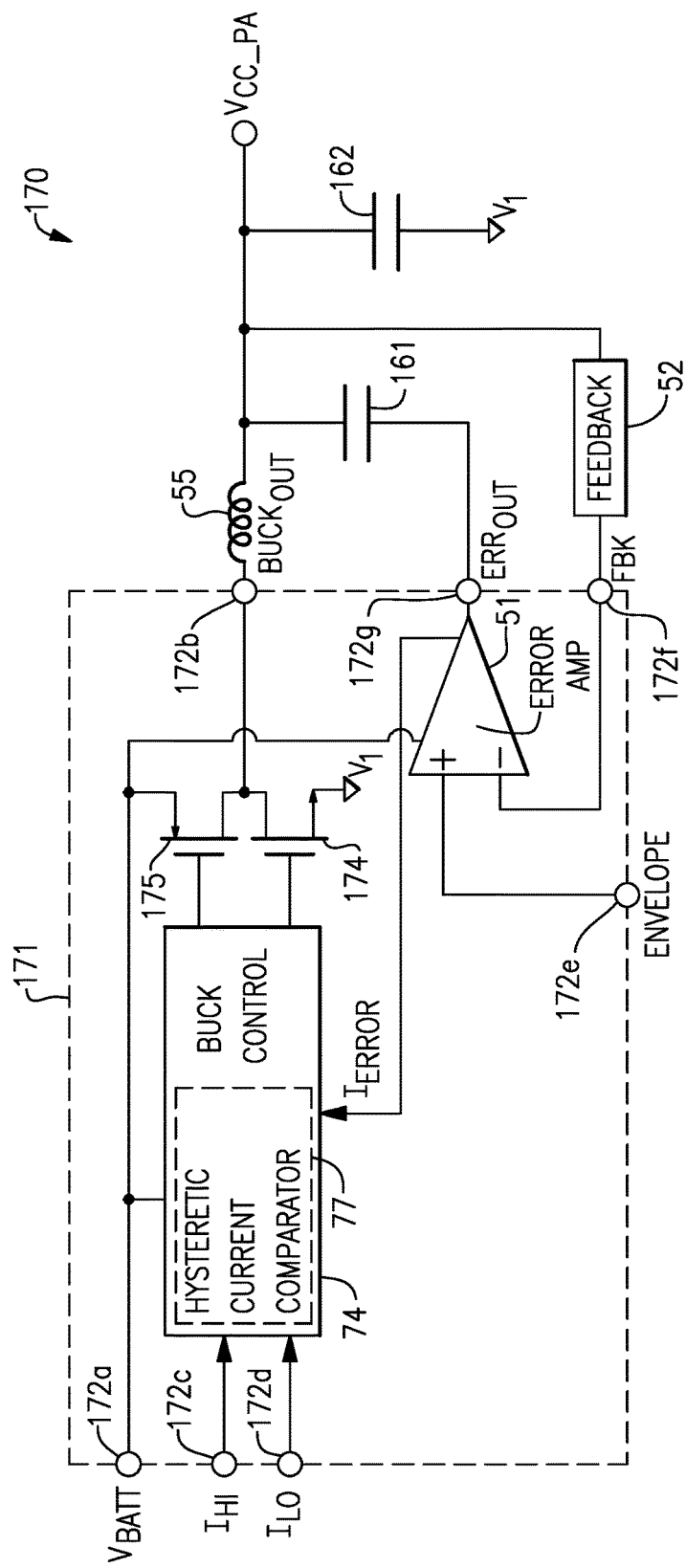
FIG. 13 is a schematic block diagram of one embodiment of an envelope tracking module.

FIG. 13 is a schematic block diagram of one embodiment of an envelope tracking module 170. The envelope tracking module 170 is configured to generate a power amplifier supply voltage $V_{CC\_PA}$, which can be used to power one or more power amplifiers.

The envelope tracking module 170 includes an envelope tracking die 171 including first to seventh pins or pads 172a-172g, the buck controller 74, the error amplifier 51, an n-type field effect transistor (NFET) 174, and a p-type field effect transistor (PFET) 175. The envelope tracking module 170 further includes an inductor 55, the feedback circuit 52, the AC coupling capacitor 161, and the bypass capacitor 162. In certain implementations, the inductor 55, the feedback circuit 52, the AC coupling capacitor 161, and the bypass capacitor 162 are implemented as components disposed on a module substrate of the power amplifier module 170 on which the envelope tracking die 171 is attached. For example, the inductor 55, the feedback circuit 52, the AC coupling capacitor 161, and/or the bypass capacitor 162 can be implemented at least in part using surface mount components (SMCs). However, other implementations are possible. Although only certain components and pins have been illustrated in FIG. 13 for clarity, the envelope tracking module 170 and/or the envelope tracking die 171 can be configured to include additional components and/or pins. Additionally, in certain implementations, the inductor 55, the feedback circuit 52, the AC coupling capacitor 161, and/or the bypass capacitor 162 can be implemented in all or part on the envelope tracking die 171.

The buck controller 74 is electrically connected to the first or $V_{BATT}$ pin 172a, which can be used to provide power to the envelope tracking die 171. The buck controller 74 includes a first control output electrically connected to a gate of the NFET 174 and a second control output electrically connected to a gate of the PFET 175. The NFET 174 further includes a source electrically connected to the power low supply voltage $V_1$ and a drain electrically connected to a drain of the PFET 175 and to the second or $BUCK_{OUT}$ pin 172b. The PFET 175 further includes a source electrically connected to the $V_{BATT}$ pin 172a.

The buck controller 74 is configured to receive the error current $I_{ERROR}$ from the error amplifier 51. Additionally, the buck controller 74 is electrically connected to the third or $I_{HI}$ pin 172c and to the fourth or $I_{LO}$ pin 172d, which can be used to provide threshold currents that the buck controller 74 can compare to the error current $I_{ERROR}$. For example, the buck controller 74 can include the hysteretic current comparator 77, which can be configured to control the NFET 174 and the PFET 175 to increase the power amplifier supply voltage $V_{CC\_PA}$ when the error current $I_{ERROR}$ is greater than the current received on the $I_{HI}$ pin 172c and to decrease the power amplifier supply voltage $V_{CC\_PA}$ when the error current $I_{ERROR}$ is less than the current received on the $I_{LO}$ pin 172d. Comparing the error current $I_{ERROR}$ to threshold currents allows the buck controller 74 to track a low frequency component of the power amplifier supply voltage $V_{CC\_PA}$. Although one configuration of the buck controller 74 has been illustrated in FIG. 13, other implementations of the buck controller 74 can be used, such as configurations in which hysteresis is implemented in other ways.

The error amplifier 51 includes a non-inverted input electrically connected to the fifth or ENVELOPE pin 172e, which can receive an envelope signal associated with a power amplifier that is powered using the envelope tracking module 170. In certain implementations, the envelope signal is provided by using at least one of a transceiver IC, a baseband processor, or a power management IC. The error amplifier 51 further includes an inverted input electrically connected to the sixth or FBK pin 172f. The error amplifier 51 further includes an output electrically connected to the seventh or $ERR_{OUT}$ pin 172g. The error amplifier 51 is configured to generate the error current $I_{ERROR}$ and to provide the error current $I_{ERROR}$ to the buck controller 74.

The inductor 55 includes a first end electrically connected to the $BUCK_{OUT}$ pin 172b and a second end electrically connected to the power amplifier supply voltage $V_{CC\_PA}$. The AC coupling capacitor 161 includes a first end electrically connected to the $ERR_{OUT}$ pin 172g and a second end electrically connected to the power amplifier supply voltage $V_{CC\_PA}$. The bypass capacitor 162 includes a first end electrically connected to the power amplifier supply voltage $V_{CC\_PA}$ and a second end electrically connected to the power low supply voltage $V_1$.

The illustrated envelope tracking module 170 can control the voltage level of the power amplifier supply voltage $V_{CC\_PA}$ using an envelope signal received on the ENVELOPE pin 172e. Additionally, the envelope tracking module 170 employs a buck converter and an error amplifier that operate in parallel to control the voltage level of the power amplifier supply voltage $V_{CC\_PA}$. In particular, the buck controller 74 including the hysteretic current comparator 77 can be used to track a low frequency component of the envelope signal, while the error amplifier 51 can be used to track a high frequency component of envelope signal by controlling the AC current delivered to the power amplifier supply voltage $V_{CC\_PA}$ based on a difference between the envelope signal and a high frequency feedback signal received from the feedback circuit 52. Furthermore, since the output of the error amplifier 51 is electrically connected to the power amplifier supply voltage $V_{CC\_PA}$ through the AC coupling capacitor 161, the envelope tracking module 170 can be used to control the voltage level of the power amplifier supply voltage $V_{CC\_PA}$ to be above that of a battery voltage received on the $V_{BATT}$ pin 172a.

As described in various configurations above, a buck converter can be configured to generate a buck voltage that has a magnitude based on an error current generated by an error amplifier. However, buck converters can be controlled in other ways. For example, in certain implementations, a power amplifier voltage can be filtered and used to generate a control voltage for controlling the buck converter. For example, in certain instances the filtered power amplifier supply voltage can be compared to a reference voltage to generate the control voltage.

Figure 14:
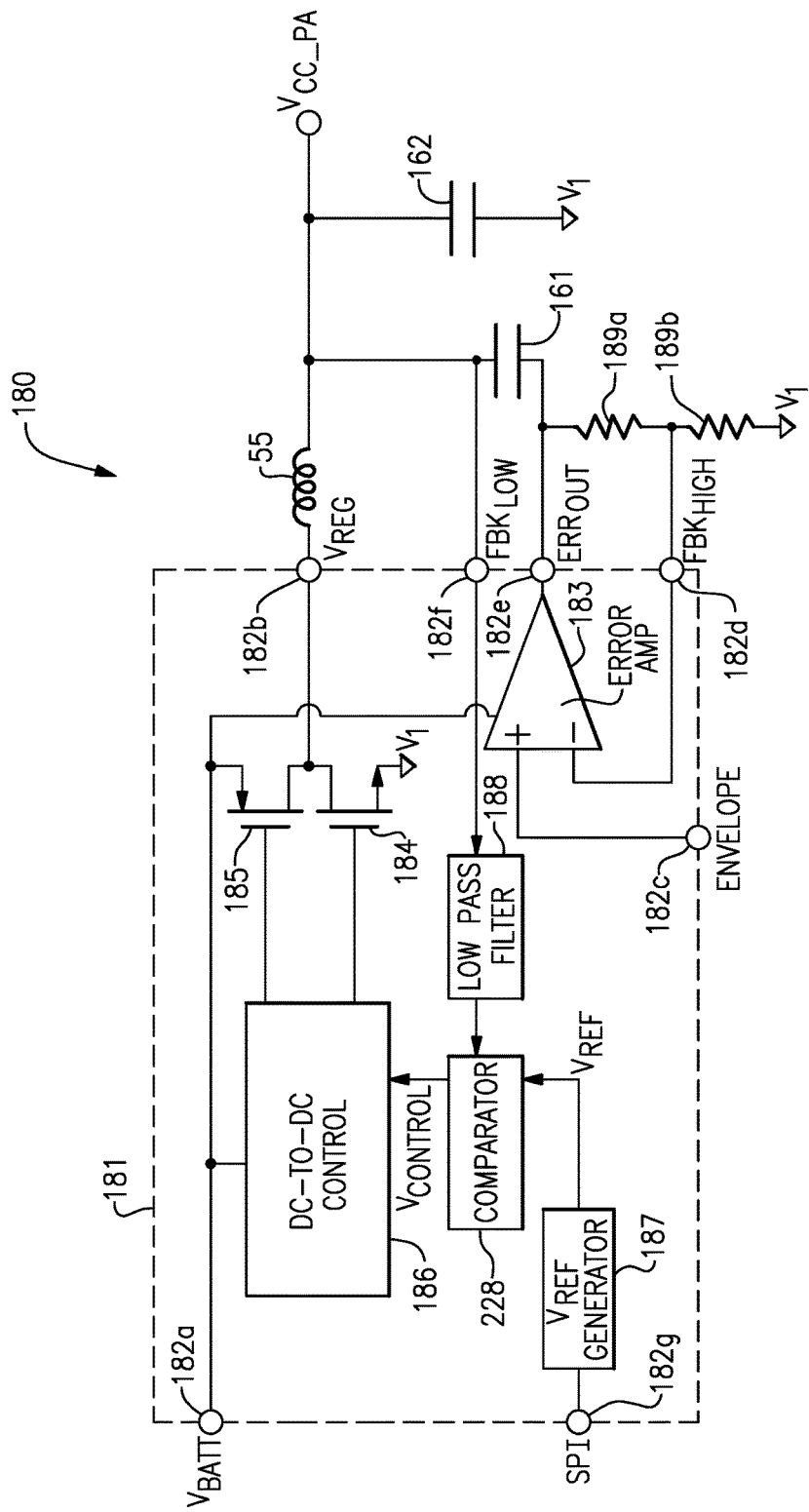
FIG. 14 is a schematic block diagram of another embodiment of an envelope tracking module.

FIG. 14 is a schematic block diagram of another embodiment of an envelope tracking module 180. The envelope tracking module 180 is configured to generate a power amplifier supply voltage $V_{CC\_PA}$, which can be used to power one or more power amplifiers.

The envelope tracking module 180 includes an envelope tracking die 181 including first to seventh pins or pads 182a-182g, an error amplifier 183, an NFET 184, a PFET 185, a DC-to-DC controller 186, a reference voltage generator 187, a low pass filter 188, and a comparator 228. The envelope tracking module 180 further includes an inductor 55, the AC coupling capacitor 161, the bypass capacitor 162, a first feedback resistor 189a, and a second feedback resistor 189b.

In certain implementations, the inductor 55, the AC coupling capacitor 161, the bypass capacitor 162, and the first and second feedback resistors 189a, 189b are implemented as components disposed on a package substrate associated with the envelope tracking die 181. However, other implementations are possible. Although only certain components and pins have been illustrated in FIG. 14 for clarity, the envelope tracking module 180 and/or the envelope tracking die 181 can be configured to include additional components and/or pins.

The DC-to-DC controller 186 is electrically connected to the first or $V_{BATT}$ pin 182a. The DC-to-DC controller 186 includes a first control output electrically connected to a gate of the NFET 184 and a second control output electrically connected to a gate of the PFET 185. The NFET 184 further includes a source electrically connected to the power low supply voltage $V_1$ and a drain electrically connected to a drain of the PFET 185 and to the second or $V_{REG}$ pin 182b. The PFET 185 further includes a source electrically connected to the $V_{BATT}$ pin 182a. The DC-to-DC controller 186 is configured to receive a control voltage $V_{CONTROL}$ from the comparator 228. The DC-to-DC controller 186 can be configured to control the gate voltages of the NFET 184 and the PFET 185 to control the voltage level of the power amplifier supply voltage $V_{CC\_PA}$ based on a voltage level of the control voltage $V_{CONTROL}$, which can operate as a low frequency feedback signal. Although the DC-to-DC controller 186 is illustrated in a buck converter configuration, the teachings herein are applicable to boost converter configurations.

The error amplifier 183 includes a non-inverted input electrically connected to the third or ENVELOPE pin 182c, which can be configured to receive an envelope signal associated with the input signal of a power amplifier that is powered using the envelope tracking module 180. In certain implementations, the envelope signal is provided by using at least one of a transceiver IC, a baseband processor, or a power management IC. The error amplifier 183 further includes an inverted input electrically connected to the fourth or $FBK_{HIGH}$ pin 182d, which has been configured to receive a high frequency feedback signal from the first and second feedback resistors 189a, 189b, as will be described below. The error amplifier 183 further includes an output electrically connected to the fifth or $ERR_{OUT}$ pin 182e. Although FIG. 14 illustrates a configuration in which resistors are used to generate a high frequency feedback signal for an error amplifier, other configurations are possible, including, for example, configurations that omit resistors and/or include resistors arranged in other ways.

The low pass filter 188 includes an input electrically connected to the sixth of $FBK_{LOW}$ pin 182e, which has been configured to receive the power amplifier supply voltage $V_{CC\_PA}$. The low pass filter 188 can be configured to filter or attenuate high frequency components of the power amplifier supply voltage $V_{CC\_PA}$ to generate a filtered power amplifier supply voltage. The reference voltage generator 187 can generate a reference voltage $V_{REF}$, which the comparator 228 can compare to the filtered power amplifier supply voltage to generate the control voltage $V_{CONTROL}$ used to control the DC-to-DC controller 186.

In the illustrated configuration, the reference voltage generator 187 is electrically connected to the seventh or SPI pin 182g, which can be associated with a data input pin of a serial peripheral interface (SPI). Although not illustrated in FIG. 14 for clarity, the envelope tracking module 180 can include additional pins associated with the serial peripheral interface, including, for example, a serial clock pin, a data output pin, and/or a select pin. The SPI pin 182g can be associated with a serial peripheral interface or bus used to provide data for controlling a voltage level of the reference voltage $V_{REF}$. For example, the reference voltage generator 187 can include a digital-to-analog (D-to-A) converter that can convert digital data received on the SPI pin 182g to an analog signal used to generate the reference voltage $V_{REF}$. In certain implementations, the SPI pin 182g can be used to dynamically change the reference voltage $V_{REF}$ to optimize the energy efficiency of a power amplifier that the envelope tracking module 180 powers. For example, the reference voltage generator 187 can be used to dynamically change the reference voltage $V_{REF}$ between transmission slots of the power amplifier so as to, for example, change the characteristics of the power amplifier supply voltage $V_{CC\_PA}$ across different power modes.

The inductor 55 includes a first end electrically connected to the $V_{REG}$ pin 182b and a second end electrically connected to the power amplifier supply voltage $V_{CC\_PA}$. The AC coupling capacitor 161 includes a first end electrically connected to the $ERR_{OUT}$ pin 182e and a second end electrically connected to the power amplifier supply voltage $V_{CC\_PA}$. The bypass capacitor 162 includes a first end electrically connected to the power amplifier supply voltage $V_{CC\_PA}$ and a second end electrically connected to the power low supply voltage $V_1$. The first feedback resistor 189a includes a first end electrically connected to the $FBK_{HIGH}$ pin 182d and a second end electrically connected to the $ERR_{OUT}$ pin 182e. The second feedback resistor 189b includes a first end electrically connected to the power low supply voltage $V_1$ and a second end electrically connected to the $FBK_{HIGH}$ pin 182d.

In the illustrated configuration, the error amplifier 183 receives a high frequency feedback signal from the first and second feedback resistors 189a, 189b. For example, in the illustrated configuration, the AC coupling capacitor 161 has been disposed between the power amplifier supply voltage $V_{CC\_PA}$ and the first and second feedback resistors 189a, 189b, thereby operating to block low frequency components of the power amplifier supply voltage $V_{CC\_PA}$ from reaching the inverted input of the error amplifier 183. Configuring the power amplifier module 180 in this manner can aid in increasing the power efficiency of the module by allowing the DC-to-DC controller 186 to track low frequency changes in the envelope signal and the error amplifier 183 to track high frequency changes in the envelope signal.

In the illustrated configuration the error amplifier 183 operates using high frequency feedback alone, and thus an error current generated by the error amplifier 183 may not include low frequency information suitable for tracking by the DC-to-DC controller 186. Thus, rather than using an error current $I_{ERROR}$ from the error amplifier 183 to control the DC-to-DC controller 186, the illustrated envelope tracking module 180 filters the power amplifier supply voltage $V_{CC\_PA}$ using the low pass filter 188 and compares the filtered power amplifier supply voltage to the reference voltage $V_{REF}$ to generate the control voltage $V_{CONTROL}$, which operates as a low frequency feedback signal.

Figure 15:
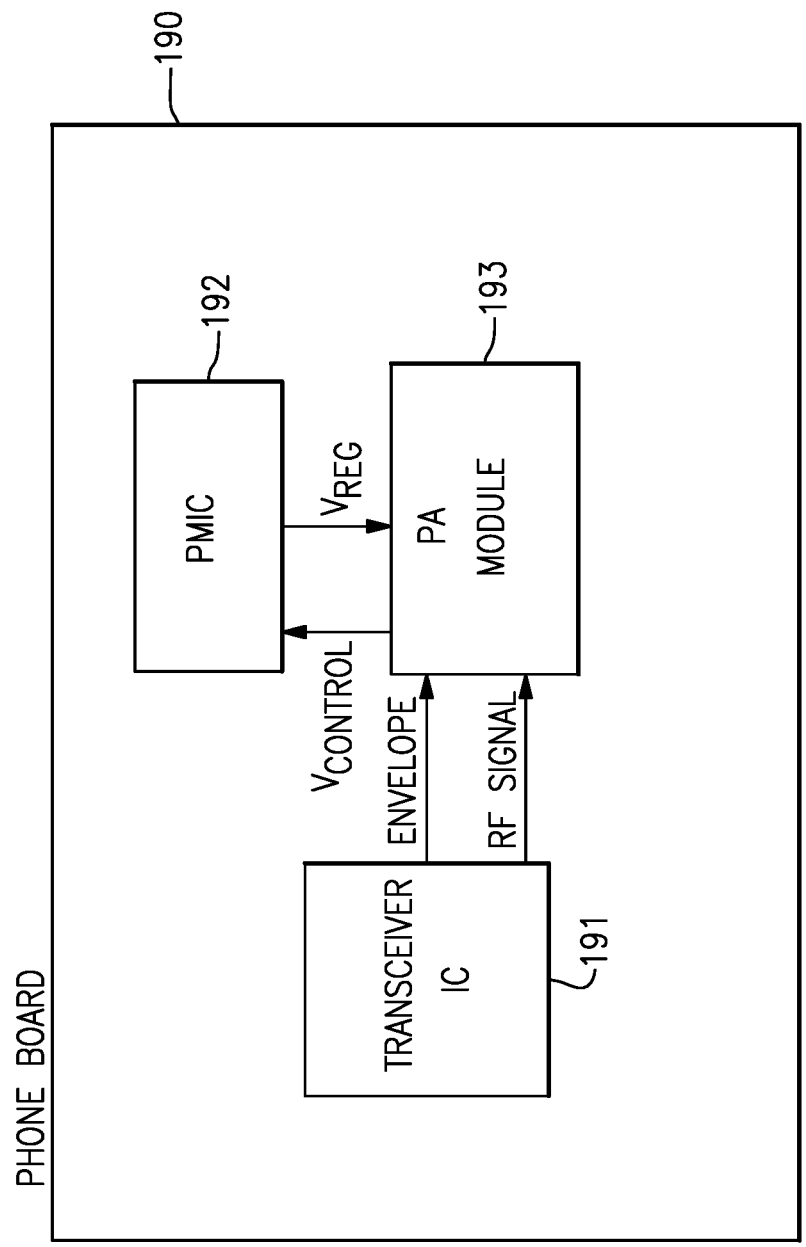
FIG. 15 is a schematic block diagram of one embodiment of a phone board.

FIG. 15 is a schematic block diagram of one embodiment of a phone board 190. The phone board 190 includes a transceiver IC 191, a power management IC (PMIC) 192, and a power amplifier (PA) module 193. The transceiver IC 191 is configured to generate a radio frequency signal (RF SIGNAL) and an envelope signal (ENVELOPE). The PA module 193 is configured to receive the envelope signal and the radio frequency signal from the transceiver IC 191. Additionally, the PA module 193 is configured to receive a regulated voltage $V_{REG}$ from the PMIC 192 and to provide a control voltage $V_{CONTROL}$ to the PMIC 192. The PMIC 192 can be configured to control a voltage level of the regulated voltage $V_{REG}$ based on a voltage level of the control voltage $V_{CONTROL}$.

The PA module 193 can be, for example, a multi-chip module (MCM) including one or more dies mounted on a surface of a module or carrier substrate. By integrating a plurality of dies and/or other components on a module, a wide variety of advantages can be achieved, including, for example, reduction of cost, improved ease of manufacture, and/or reduction in the length of interconnections.

The PMIC 192 can include one or more dies and/or other components configured to generate a regulated voltage for the PA module 193. The PMIC 192 can include, for example, one or more DC-to-DC converters, low drop out (LDO) regulators, and/or other circuitry configured to generate one or more regulated supply voltages for components of the phone board 190, including, for example, the PA module 193. The PMIC 192 can be configured to generate the one or more power supply voltages using a battery voltage from a battery. In certain implementations, the PMIC 192 can include a battery charger for providing power path management to the battery.

The PA module 193 can generate the control voltage $V_{CONTROL}$, which can be used by the PMIC 192 to control a voltage level of the regulated voltage $V_{REG}$ that is provided to the PA module 193. As will be described in detail below, the PA module 193 can include an error amplifier configured to adjust a voltage level of the regulated voltage $V_{REG}$ based on the envelope signal ENVELOPE received from the transceiver IC 191. Additionally, the PA module 193 can include feedback circuitry configured to adjust a voltage level of the control voltage $V_{CONTROL}$. The PA module 193 can use the control voltage $V_{CONTROL}$ to control a voltage level of the regulated voltage $V_{REG}$ in a manner similar to that described earlier with respect to FIG. 14. Accordingly, the PA module 193 and the PMIC 192 can collectively operate to provide envelope tracking to power amplifiers disposed on the PA module 193.

The phone board 190 of FIG. 9 includes an envelope tracking system for providing envelope signal tracking without requiring a dedicated envelope tracking module or die. Thus, the phone board 190 can operate using envelope tracking functionality while having reduced board cost and/or area relative to a scheme in which a phone board includes a dedicated envelope tracking module or die. Although FIG. 15 illustrates a configuration in which the envelope signal is generated using the transceiver IC 191, other configurations are possible.

Figure 16A:
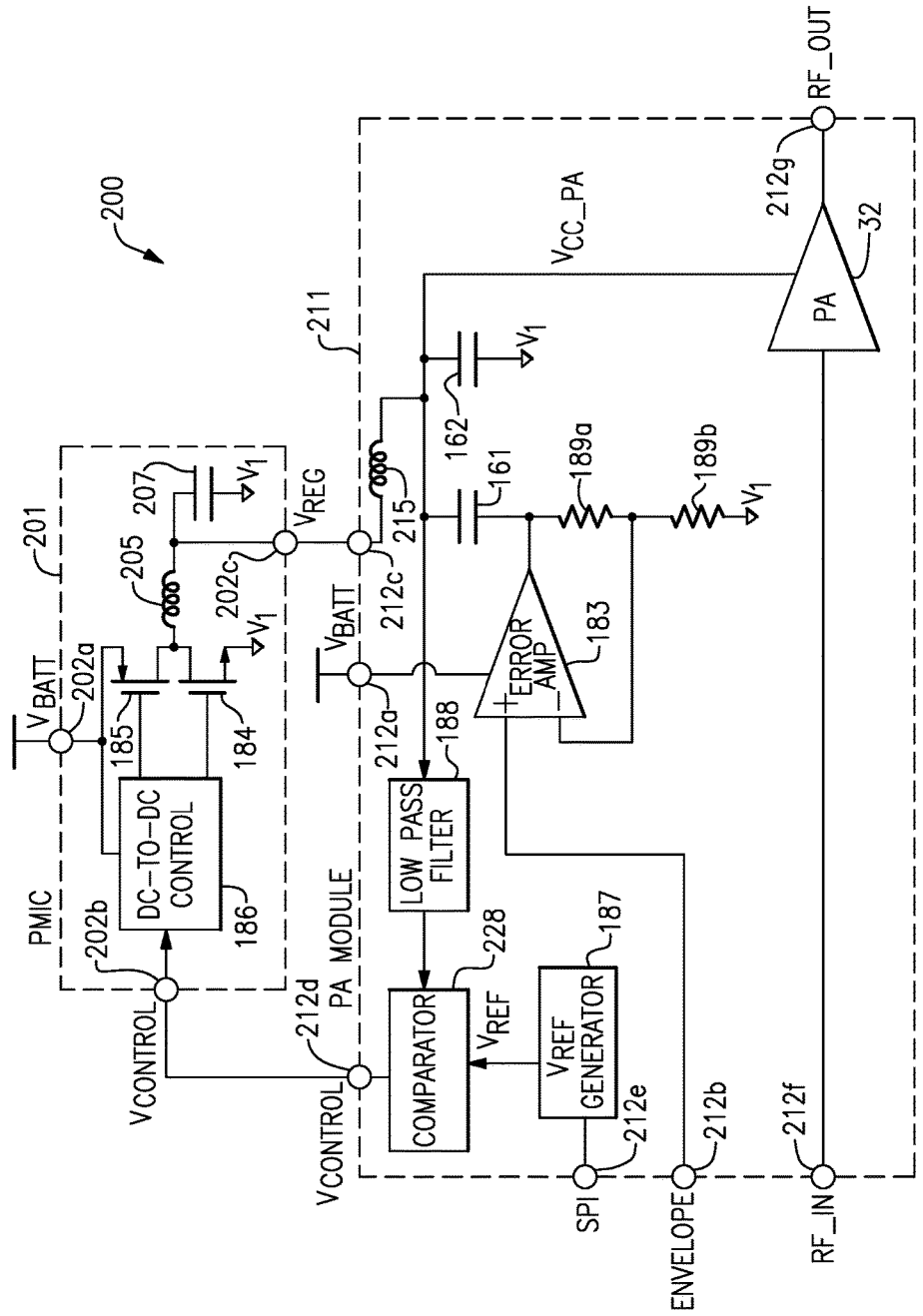
FIG. 16A is a schematic block diagram of one embodiment of an RF system.

FIG. 16A is a schematic block diagram of one embodiment of an RF system 200. The RF system 200 includes a power amplifier (PA) module 211 and a power management integrated circuit (PMIC) 201. In one embodiment, the RF system 200 is a portion of a phone board of a wireless device.

The PMIC 201 includes the NFET 184, the PFET 185, the DC-to-DC controller 186, first to third pins 202a-202c, a PMIC inductor 205, and a PMIC capacitor 207. Although the PMIC 201 is illustrated as including certain components and pins for clarity, the PMIC 201 can be adapted to include additional components and/or pins.

The DC-to-DC controller 186 includes a supply input electrically connected to the first or $V_{BATT}$ pin 202a, which can be configured to receive a battery voltage $V_{BATT}$ from a battery. The DC-to-DC controller 186 further includes a control input electrically connected to the second or $V_{CONTROL}$ pin 202b. The DC-to-DC controller 186 includes a first control output electrically connected to a gate of the NFET 184 and a second control output electrically connected to a gate of the PFET 185. The PFET 185 further includes a source electrically connected to the $V_{BATT}$ pin 202a and a drain electrically connected to a drain of the NFET 184 and to a first end of the PMIC inductor 205. The NFET 184 further includes a source electrically connected to the power low supply voltage $V_1$, and the PMIC inductor 205 further includes a second end electrically connected to the third or $V_{REG}$ pin 202c, which can be used to provide a regulated voltage to the power amplifier module 211. The PMIC capacitor 207 is electrically connected between the $V_{REG}$ pin 202c and the power low supply voltage $V_1$. The DC-to-DC controller 186 can be configured to control the gate voltages of the NFET 184 and the PFET 185 so as to control the voltage level of the $V_{REG}$ pin 202c based on a voltage level of a control voltage received on the $V_{CONTROL}$ pin 202b. Although the PMIC 201 is illustrated for a buck converter configuration, the PMIC 201 can be adapted to provide a boost voltage. Thus, the regulated voltage $V_{REG}$ can be a buck voltage, a boost voltage, or a voltage that changes between a buck voltage and a boost voltage over time.

The power amplifier module 211 includes the power amplifier 32, the AC coupling capacitor 161, the bypass capacitor 162, the error amplifier 183, the reference voltage generator 187, the low pass filter 188, the first feedback resistor 189a, the second feedback resistor 189b, the first to seventh pins 212a-212g, an inductor 215, and the comparator 228. Although the power amplifier module 211 is illustrated as including certain components and pins for clarity, the power amplifier module 211 can be adapted to include additional components and/or pins.

The second feedback resistor 189b includes a first end electrically connected to the power low supply voltage $V_1$ and a second end electrically connected to an inverted input of the error amplifier 183 and to a first end of the first feedback resistor 189a. The first feedback resistor 189a further includes a second end electrically connected to a first end of the AC coupling capacitor 161 and to an output of the error amplifier 183. The error amplifier 183 further includes a supply input electrically connected to the first or $V_{BATT}$ pin 212a, which can be configured to receive the battery voltage $V_{BATT}$. The error amplifier 183 further includes a non-inverted input electrically connected to the second or ENVELOPE pin 212b. The AC coupling capacitor 161 further includes a second end electrically connected to the power amplifier supply voltage $V_{CC\_PA}$.

The inductor 215 includes a first end electrically connected to the third or $V_{REG}$ pin 212c and a second end electrically connected to the power amplifier supply voltage $V_{CC\_PA}$. The capacitor 162 includes a first end electrically connected to the power amplifier supply voltage $V_{CC\_PA}$ and a second end electrically connected to the power low supply voltage $V_1$. The low pass filter 188 includes an input electrically connected to the power amplifier supply voltage $V_{CC\_PA}$ and an output electrically connected to a first input of the comparator 228. The comparator 228 further includes an output electrically connected to the fourth or $V_{CONTROL}$ pin 212d and a second input configured to receive a reference voltage $V_{REF}$ from an output of the reference voltage generator 187. The reference voltage generator 187 further includes an input electrically connected to the fifth or SPI pin 212e, which can be associated with a data input pin of a serial peripheral interface. The power amplifier 32 includes a supply input configured to receive the power amplifier supply voltage $V_{CC\_PA}$, a signal input electrically connected to the sixth or RF_IN pin 212f, and a signal output electrically connected to the seventh or RF_OUT pin 212g.

The low pass filter 188 can be configured to filter or attenuate high frequency components of the power amplifier supply voltage $V_{CC\_PA}$ to generate a filtered power amplifier supply voltage for the comparator 228. The comparator 228 can also receive the reference voltage $V_{REF}$ from the reference voltage generator 187, and can compare the reference voltage $V_{REF}$ to the filtered power amplifier supply voltage to generate the control voltage $V_{CONTROL}$ that is used to control the DC-to-DC controller 186 of the PMIC 201. In the illustrated configuration, the reference voltage generator 187 is electrically connected to the SPI pin 212e, which can be coupled to a serial peripheral interface or bus that provides data for controlling a voltage level of the reference voltage $V_{REF}$. For example, the reference voltage generator 187 can include a digital-to-analog (D-to-A) converter that can convert digital data received on the SPI pin 212e to an analog signal used to generate the reference voltage $V_{REF}$.

In the illustrated configuration, the AC coupling capacitor 161 has been disposed between the power amplifier supply voltage $V_{CC\_PA}$ and the series combination of the first and second feedback resistors 189a, 189b, thereby operating to block low frequency content associated with the power amplifier supply voltage $V_{CC\_PA}$ from reaching the inverted input of the error amplifier 183. Thus, the error amplifier 183 shown in FIG. 16A operates using high frequency feedback alone. Additionally, the comparator 228 generates the control voltage $V_{CONTROL}$, which operates as a low frequency feedback signal that is based on a comparison of the filtered power amplifier supply voltage generated by the low pass filter 188 and the reference voltage $V_{REF}$ generated by the reference voltage generator 187.

The RF system 200 illustrates a scheme in which the error amplifier 183 has been included on the power amplifier module 211. Including both the error amplifier 183 and the power amplifier 32 on the power amplifier module 211 can reduce the size of an inductor (such as the inductor 27 of FIG. 3B) used to provide a supply voltage to the power amplifier 32. For example, the error amplifier 183 and the power amplifier 32 are both electrically connected to the second end of the inductor 215, and thus a high frequency error current generated by the error amplifier 183 need not pass through the inductor 215 and contribute to the inductor's L*dI/dt noise. Thus, integrating the error amplifier 183 on a common module with the power amplifier 32 can reduce the size of the inductor used to provide a supply voltage to the power amplifier 32 for a given amount of power supply noise.

Figure 16B:
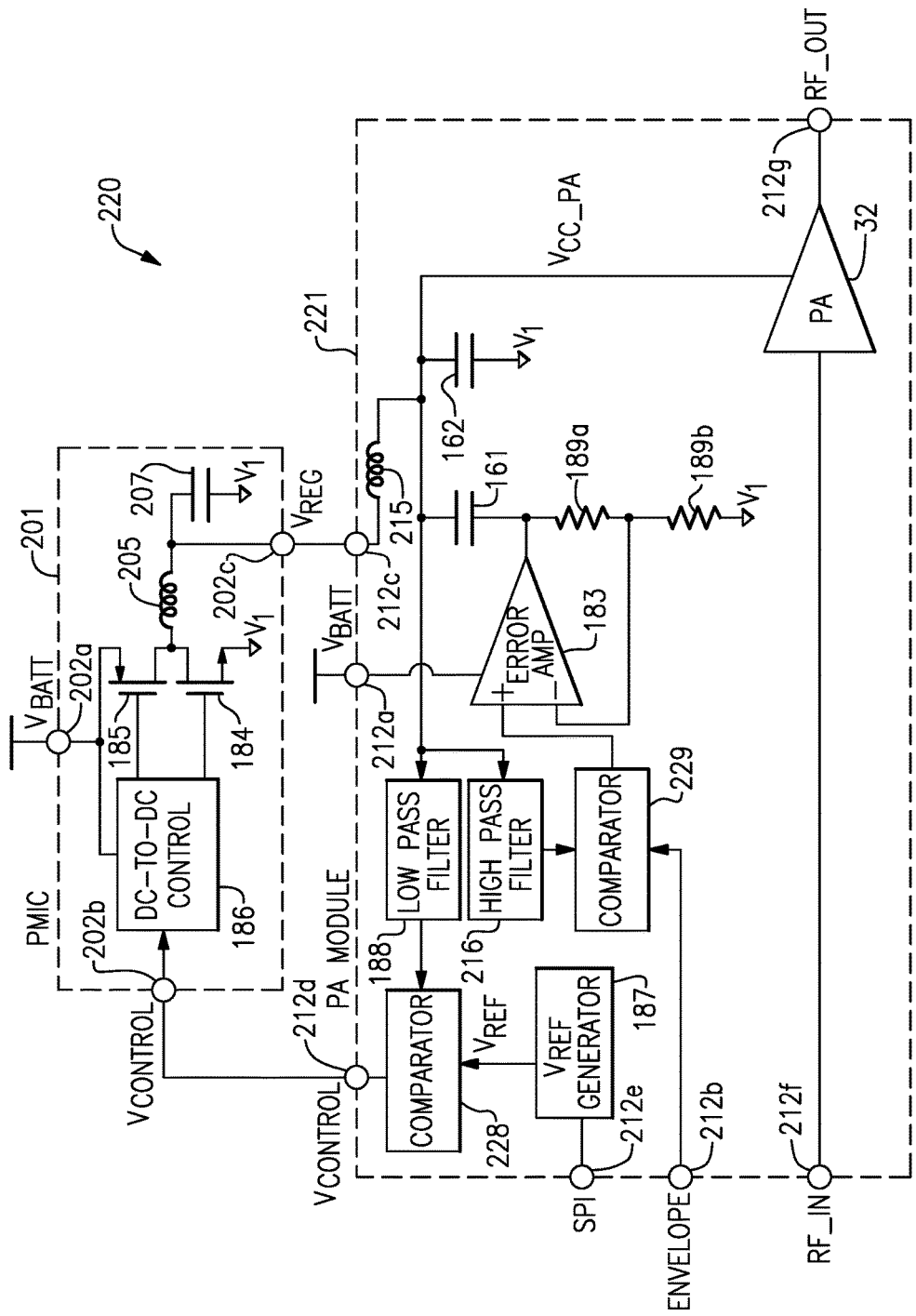
FIG. 16B is a schematic block diagram of another embodiment of an RF system.

FIG. 16B is a schematic block diagram of another embodiment of an RF system 220. The RF system 220 includes a power amplifier module 221 and the PMIC 201. The RF system 220 of FIG. 16B of is similar to the RF system 200 of FIG. 16A, except that the RF system 220 of FIG. 16B includes a different power amplifier module configuration. In particular, in contrast to the power amplifier module 211 of FIG. 16A, the power amplifier module 221 of FIG. 16B further includes a high pass filter 216 and a comparator 229. The high pass filter 216 includes an input configured to receive the power amplifier supply voltage $V_{CC\_PA}$ and an output configured to provide a filtered power amplifier supply voltage to the comparator 229. The high pass filter 216 can filter or remove low frequency components of the power amplifier supply voltage $V_{CC\_PA}$ to generate a high pass filtered power amplifier supply voltage. The comparator 229 is further configured to receive an envelope signal from the ENVELOPE pin 212b, and to compare the high pass filtered power amplifier supply voltage to the envelope signal to generate a high frequency envelope signal for the non-inverted input of the error amplifier 183.

Although FIGS. 16A-16B illustrate configurations of RF systems that include the AC coupling capacitor 161, in certain implementations, the AC coupling capacitor 161 can be omitted to reduce component count. For example, although omitting the AC coupling capacitor 161 can reduce the maximum voltage level that the error amplifier 183 can control the power amplifier supply voltage $V_{CC\_PA}$ to, such RF systems can be used, for example, to power one or more power amplifiers that drive a relatively small load line impedance and thus have a relatively small output voltage swing.

Figure 17A:
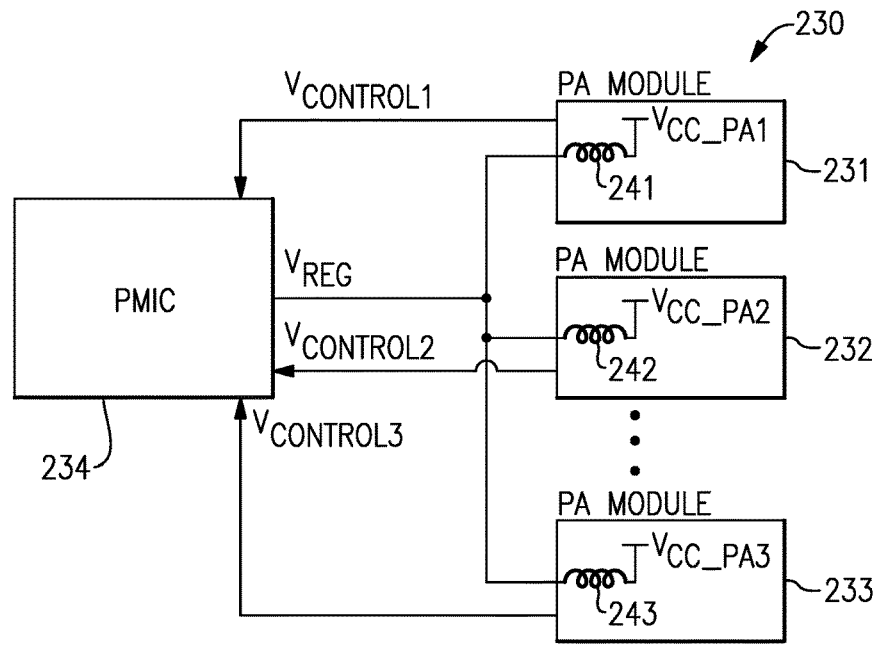
FIG. 17A is a schematic block diagram of a multi-band power amplifier system in accordance with one embodiment.

FIG. 17A is a schematic block diagram of a multi-band power amplifier system 230 in accordance with one embodiment. The illustrated multi-band power amplifier system 230 includes a first power amplifier module 231, a second power amplifier module 232, a third power amplifier module 233, and a power management IC 234. The first power amplifier module 231 includes a first inductor 241, the second power amplifier module 232 includes a second inductor 242, and the third power amplifier module 233 includes a third inductor 243. Although the multi-band power amplifier system 230 is illustrated as including three power amplifier modules, the multi-band power amplifier system 230 can be adapted to include more or fewer power amplifier modules.

The first to third power amplifier modules 231-233 can each be configured to communicate over a different RF communication band. Providing a plurality of power amplifiers in a multi-band power amplifier system can aid in increasing power efficiency of the system and/or in relaxing the design constraints of the power amplifiers, as each power amplifier can be separately optimized for the particular band that the power amplifier amplifies.

The PMIC 234 has been configured to generate a regulated voltage $V_{REG}$, which has been provided to a first end of each of the first to third inductors 241-243. The first to third inductors 241-243 each include a second end electrically connected to a power amplifier supply voltage local to each power amplifier module. For example, the first inductor 241 includes a second electrically connected to a first power amplifier supply voltage $V_{CC\_PA1}$ associated with the first power amplifier module 231, the second inductor 242 includes a second end electrically connected to a second power amplifier supply voltage $V_{CC\_PA2}$ associated with the second power amplifier module 232, and the third inductor 243 includes a second end electrically connected to a third power amplifier supply voltage $V_{CC\_PA3}$ associated with the third power amplifier module 233. The first to third power amplifier modules 231-233 have also been configured to generate first to third control voltages $V_{CONTROL1}$-$V_{CONTROL3}$, which have been provided to the PMIC 234.

The PMIC 234 can be used to control the voltage level of the regulated voltage $V_{REG}$ based on a control voltage received from an enabled or active power amplifier module. For example, when a power amplifier on the first power amplifier module 231 is enabled, the PMIC 234 can be used to control a voltage level of the first power amplifier supply voltage $V_{CC\_PA1}$ based on a voltage level of the first control voltage $V_{CONTROL1}$. Similarly, when a power amplifier on the second power amplifier module 232 is enabled, the PMIC 234 can be used to control a voltage level of the second power amplifier supply voltage $V_{CC\_PA2}$ based on a voltage level of the second control voltage $V_{CONTROL2}$. Likewise, when a power amplifier on the third power amplifier module 233 is enabled, the PMIC 234 can be used to control a voltage level of the third power amplifier supply voltage $V_{CC\_PA3}$ based on a voltage level of the third control voltage $V_{CONTROL3}$. In certain implementations, the first to third control voltages $V_{CONTROL1}$-$V_{CONTROL3}$ can be provided to the PMIC 234 using a shared electrical connection, such as a shared phone board trace, and the multi-band power amplifier system 230 can be configured such that at most one of the first to third control voltages $V_{CONTROL1}$-$V_{CONTROL3}$ is active at a time.

In a manner similar to that described earlier with respect to FIGS. 14A-14B, each of the power amplifier modules 231-233 can include an error amplifier used to adjust a respective power amplifier supply voltage to track the envelope of an RF signal amplified by the power amplifier module. Thus, the multi-band power amplifier system 230 of FIG. 17A illustrates an implementation in which the first to third power amplifier supply voltages $V_{CCPA1}$-$V_{CC\_PA3}$ can be envelope tracking supplies which use a common regulated voltage $V_{REG}$ generated by the PMIC 234.

Figure 17B:
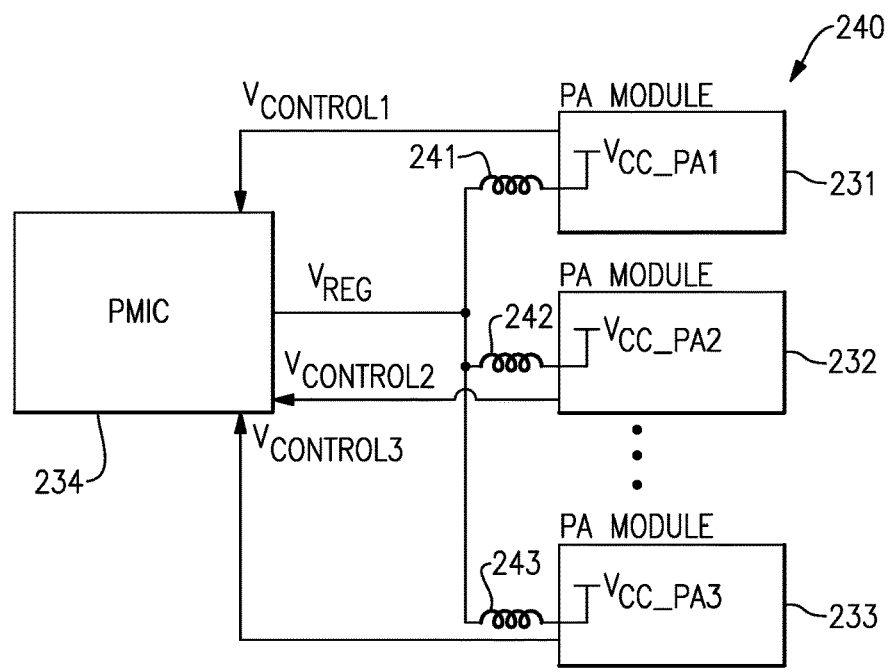
FIG. 17B is a schematic block diagram of a multi-band power amplifier system in accordance with another embodiment.

FIG. 17B is a schematic block diagram of a multi-band power amplifier system 240 in accordance with another embodiment. The illustrated multi-band power amplifier system 240 includes the first to third power amplifier modules 231-233, the PMIC 234, and the first to third inductors 241-243. The multi-band power amplifier system 240 of FIG. 17B is similar to the multi-band power amplifier system 230 of FIG. 17A, except that the multi-band power amplifier system 240 of FIG. 17B illustrates a configuration in which the first to third inductors 241-243 have been disposed external to the first to third power amplifier modules 231-233, respectively. For example, the first to third inductors 241-243 can be disposed on a phone board associated with the multi-band power amplifier system 240. The teachings herein are applicable to configurations in which an inductor is implemented on a power amplifier module, implemented on a phone board, or a combination thereof.

Figure 18:
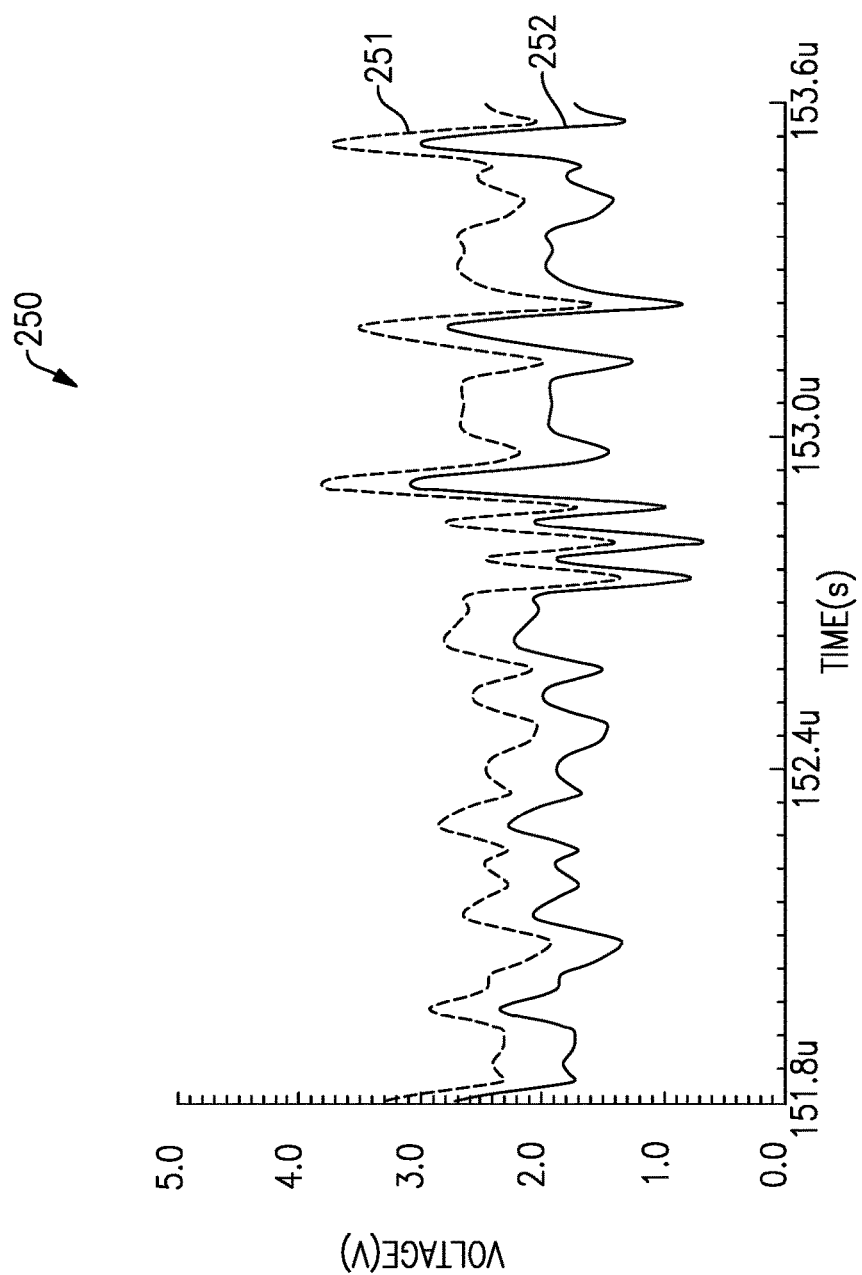
FIG. 18 shows one example of a graph of voltage versus time for the envelope tracking system of FIG. 12.

FIG. 18 shows one example of a graph 250 of voltage versus time for the envelope tracking system 160 of FIG. 12. The graph 250 includes a first plot 251 of voltage versus time and a second plot 252 of voltage versus time. The graph 250 can correspond to one example of the voltages of the envelope tracking system 160 of FIG. 12. For example, the first plot 251 can correspond to the power amplifier supply voltage $V_{CC\_PA}$ of FIG. 12 and the second plot 252 can correspond to the output voltage of the error amplifier 51 of FIG. 12.

Figure 19:
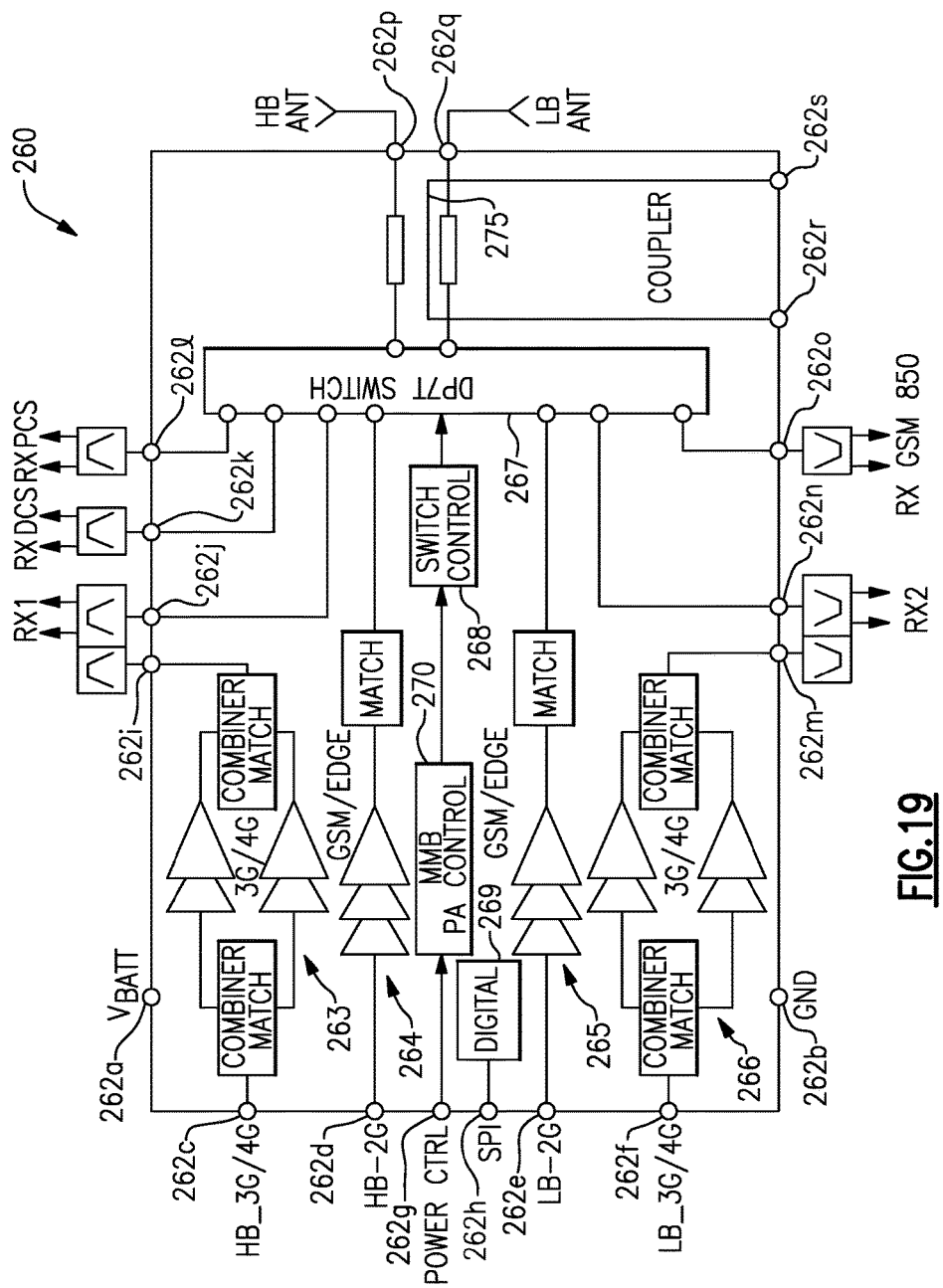
FIG. 19 is a schematic block diagram of a multi-mode power amplifier module in accordance with one embodiment.

FIG. 19 is a schematic block diagram of a multi-mode power amplifier (PA) module 260 in accordance with one embodiment.

The multi-mode PA module 260 includes a first or $V_{BATT}$ pin 262a configured to receive a battery voltage and a second or GND pin 262b configured to receive a ground voltage. Additionally, the multi-mode PA module 260 further includes a third or HB_3G/4G pin 262c configured to receive a high band 3G/4G signal, which can be amplified by high band 3G/4G power amplifier circuitry 263 and provided to a ninth pin 262i. The amplified high band 3G/4G signal provided to the ninth pin 262i can be filtered using an external filter and/or duplexer. The multi-mode PA module 260 further includes a fourth or HB-2G pin 262d that can receive a high band 2G signal, which can be amplified by high band 2G power amplifier circuitry 264. The multi-mode PA module 260 further includes a fifth or LB-2G pin 262e configured to receive a low band 2G signal, which can be amplified by low band 2G power amplifier circuitry 265. Additionally, the multi-mode PA module 260 includes a sixth or LB_3G/4G pin 262f configured to receive a low band 3G/4G signal, which can be amplified by low band 3G/4G power amplifier circuitry 266 and provided to a thirteenth pin 262m. The amplified low band 3G/4G signal provided to the thirteenth pin 262m can be filtered using an external filter and/or duplexer.

A seventh pin 262g (POWER CTRL) can be used to provide a power control signal to a power amplifier control block 270, which in certain implementations can be a millimeter-wave mobile broadband (MMB) power amplifier control system. The multi-mode PA module 260 further includes an eighth or serial peripheral interface (SPI) pin 262h, which can be electrically connected to a digital control block 269. The power amplifier control block 270 and the digital control block 269 can be used to allow external circuitry to control the functionality of the multi-mode PA module 260, such as to select a power mode or active path. The power amplifier control block 270 and/or the digital control block 269 can be configured to control other components or blocks of the multi-mode PA module 260. For example, in the illustrated configuration, the power amplifier control block 270 is configured to control a switch control block 268.

The switch control block 268 can be used to select the active path of the multi-mode PA module 260 by controlling the switch 267. In the illustrated configuration, the switch 267 is a double-pole seven-throw (DP7T) switch configured to receive seven input signals. In particular, the switch 267 is configured to receive a first signal from a twelfth or PCS pin 262l, a second signal from an eleventh or DCS pin 262k, a third signal from a tenth or RX1 pin 262j, a fourth signal from the high band 2G power amplifier circuitry 264, a fifth signal from the low band 2G power amplifier circuitry 265, a sixth signal from a fourteenth or RX2 pin 262n, and a seventh signal from a fifteenth or GSM pin 262o. The switch 267 includes a first output electrically connected to a sixteenth pin 262p, which can be connected to a high band antenna (HB ANT). The switch 267 further includes a second output electrically connected to a seventeenth pin 262q, which can be connected to a low band antenna (LB ANT). A directional coupler 275 can be used to sense signals provided to the high band and low band antennas on the sixteenth and seventeenth pins 262p, 262q, respectively. The directional coupler 275 includes a first port electrically connected to an eighteenth pin 262r and a second port electrically connected to a nineteenth pin 262s.

Although FIG. 19 illustrates one example of a multi-mode PA, the multi-mode PA can be implemented in other implementations, including configurations using a different arrangement of circuitry, configurations that amplify a different combination of signal bands, and configurations using more or fewer components and/or pins.

Applications

Some of the embodiments described above have provided examples in connection with wireless devices or mobile phones. However, the principles and advantages of the embodiments can be used for any other systems or apparatus that have needs for envelope trackers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a power amplifier configured to amplify a radio frequency signal and to receive power from a power amplifier supply voltage;
a DC-to-DC converter configured to generate a regulated voltage;
a high pass filter configured to generate a high pass filtered supply voltage based on high pass filtering the power amplifier supply voltage;
a first comparator configured to generate a high frequency envelope signal based on comparing the high pass filtered supply voltage to an envelope signal that changes in relation to an envelope of the radio frequency signal; and
an error amplifier configured to generate the power amplifier supply voltage by adjusting a voltage level of the regulated voltage based on the high frequency envelope signal.

2. The mobile device of claim 1 wherein the DC-to-DC converter is configured to generate the regulated voltage based on a control voltage.

3. The mobile device of claim 2 further comprising a low pass filter configured to generate a low pass filtered supply voltage based on low pass filtering the power amplifier supply voltage, and a second comparator configured to control a voltage level of the control voltage based on comparing the low pass filtered supply voltage to a reference voltage.

4. The mobile device of claim 3 further comprising a reference voltage generator configured to control a voltage level of the reference voltage based on digital data received over a serial interface.

5. The mobile device of claim 1 further comprising an AC coupling capacitor connected between an output of the error amplifier and the power amplifier supply voltage.

6. The mobile device of claim 5 further comprising a feedback circuit connected to the output of the error amplifier and configured to generate a feedback signal, the error amplifier including a first input configured to receive the high frequency envelope signal and a second input configured to receive the feedback signal.

7. The mobile device of claim 1 further comprising an inductor connected between the regulated voltage and the power amplifier supply voltage.

8. The mobile device of claim 1 further comprising a transceiver configured to generate the radio frequency signal and the envelope signal.

9. The mobile device of claim 1 further comprising a battery configured to provide a battery voltage to the DC-to-DC converter and to the error amplifier.

10. A radio frequency system comprising:
a power management integrated circuit including a DC-to-DC converter configured to generate a regulated voltage; and
a power amplifier module including a power amplifier configured to amplify a radio frequency signal and to receive power from a power amplifier supply voltage, a high pass filter configured to generate a high pass filtered supply voltage based on high pass filtering the power amplifier supply voltage, a first comparator configured to generate a high frequency envelope signal based on comparing the high pass filtered supply voltage to an envelope signal that changes in relation to an envelope of the radio frequency signal, and an error amplifier configured to generate the power amplifier supply voltage by adjusting a voltage level of the regulated voltage based on the high frequency envelope signal.

11. The radio frequency system of claim 10 wherein the DC-to-DC converter is configured to generate the regulated voltage based on a control voltage.

12. The radio frequency system of claim 11 wherein the power amplifier module further includes a low pass filter configured to generate a low pass filtered supply voltage based on low pass filtering the power amplifier supply voltage, and a second comparator configured to control a voltage level of the control voltage based on comparing the low pass filtered supply voltage to a reference voltage.

13. The radio frequency system of claim 12 wherein the power amplifier module further includes a serial interface configured to receive digital data and a reference voltage generator configured to control a voltage level of the reference voltage based on the digital data.

14. The radio frequency system of claim 10 wherein the power amplifier module further includes an AC coupling capacitor connected between an output of the error amplifier and the power amplifier supply voltage.

15. The radio frequency system of claim 14 wherein the power amplifier module further includes a feedback circuit connected to the output of the error amplifier and configured to generate a feedback signal, the error amplifier including a first input configured to receive the high frequency envelope signal and a second input configured to receive the feedback signal.

16. The radio frequency system of claim 10 wherein the power amplifier module further includes an inductor connected between the regulated voltage and the power amplifier supply voltage.

17. A method of envelope tracking in a power amplifier system, the method comprising:
providing a power amplifier supply voltage to a power amplifier;
amplifying a radio frequency signal using the power amplifier;
generating a regulated voltage using a DC-to-DC converter;
high pass filtering the power amplifier supply voltage to generate a high pass filtered supply voltage;
generating a high pass envelope signal based on comparing the high pass filtered supply voltage to an envelope signal that changes in relation to an envelope of the radio frequency signal; and
generating the power amplifier supply voltage by adjusting a voltage level of the regulated voltage based on the high frequency envelope signal using an error amplifier.

18. The method of claim 17 further comprising providing a control voltage to the DC-to-DC converter, and generating the regulated voltage based on the control voltage.

19. The method of claim 18 further comprising generating a low pass filtered supply voltage based on low pass filtering the power amplifier supply voltage, and controlling a voltage level of the control voltage based on comparing the low pass filtered supply voltage to a reference voltage.

20. The method of claim 19 further comprising receiving digital data over a serial interface, and controlling a voltage level of the reference voltage based on the digital data.

* * * * *